United States Patent
El Baraji et al.

(10) Patent No.: US 10,255,962 B1
(45) Date of Patent: Apr. 9, 2019

(54) MICROWAVE WRITE-ASSIST IN ORTHOGONAL STT-MRAM

(71) Applicant: Spin Memory, Inc., Fremont, CA (US)

(72) Inventors: Mourad El Baraji, Fremont, CA (US); Kadriye Deniz Bozdag, Sunnyvale, CA (US); Marcin Jan Gajek, Berkeley, CA (US); Michail Tzoufras, Sunnyvale, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/859,514

(22) Filed: Dec. 30, 2017

(51) Int. Cl.
| | |
|---|---|
| G11C 11/00 | (2006.01) |
| G11C 11/16 | (2006.01) |
| H01L 43/02 | (2006.01) |
| H01F 10/32 | (2006.01) |
| H01L 43/10 | (2006.01) |
| H01L 43/08 | (2006.01) |
| H01L 27/22 | (2006.01) |

(52) U.S. Cl.
CPC ........ *G11C 11/1675* (2013.01); *G11C 11/161* (2013.01); *H01F 10/329* (2013.01); *H01F 10/3254* (2013.01); *H01F 10/3286* (2013.01); *H01L 43/02* (2013.01); *H01L 43/08* (2013.01); *H01L 43/10* (2013.01); *G11C 11/1673* (2013.01); *H01L 27/222* (2013.01)

(58) Field of Classification Search
CPC .............. G11C 11/1675; G11C 11/161; G11C 11/1673; H01L 43/02; H01L 43/10; H01L 43/08; H01L 27/222; H01F 10/3286; H01F 10/3254; H01F 10/329

USPC .............................. 365/158, 171, 173, 50, 66
See application file for complete search history.

(56) References Cited

U.S. PATENT DOCUMENTS

| | | |
|---|---|---|
| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |

(Continued)

FOREIGN PATENT DOCUMENTS

| | | |
|---|---|---|
| CA | 2766141 A1 | 1/2011 |
| CN | 101036195 A | 9/2008 |

(Continued)

OTHER PUBLICATIONS

International Search Report and Written Opinion dated May 10, 2018 in PCT/US2018/014645; 14 pages.

(Continued)

*Primary Examiner* — Viet Q Nguyen
(74) *Attorney, Agent, or Firm* — Arnold & Porter Kaye Scholer

(57) ABSTRACT

Methods and structures useful for magnetoresistive random-access memory (MRAM) are disclosed. The MRAM device has a magnetic tunnel junction stack having a significantly improved performance of the free layer in the magnetic tunnel junction structure. The MRAM device also utilizes an external magnetic field generator, thereby allowing efficient writing of the bit without a concomitant increase in read disturb.

45 Claims, 10 Drawing Sheets

(56) References Cited

U.S. PATENT DOCUMENTS

| | | | |
|---|---|---|---|
| 5,856,897 | A | 1/1999 | Mauri |
| 5,896,252 | A | 4/1999 | Kanai |
| 5,966,323 | A | 10/1999 | Chen et al. |
| 6,016,269 | A | 1/2000 | Peterson et al. |
| 6,055,179 | A | 4/2000 | Koganei et al. |
| 6,097,579 | A | 8/2000 | Gill |
| 6,124,711 | A | 9/2000 | Tanaka et al. |
| 6,134,138 | A | 10/2000 | Lu et al. |
| 6,140,838 | A | 10/2000 | Johnson |
| 6,154,349 | A | 11/2000 | Kanai et al. |
| 6,172,902 | B1 | 1/2001 | Wegrowe et al. |
| 6,233,172 | B1 | 5/2001 | Chen et al. |
| 6,243,288 | B1 | 6/2001 | Ishikawa et al. |
| 6,252,798 | B1 | 6/2001 | Satoh et al. |
| 6,256,223 | B1 | 7/2001 | Sun |
| 6,292,389 | B1 | 9/2001 | Chen et al. |
| 6,347,049 | B1 | 2/2002 | Childress et al. |
| 6,376,260 | B1 | 4/2002 | Chen et al. |
| 6,385,082 | B1 | 5/2002 | Abraham et al. |
| 6,436,526 | B1 | 8/2002 | Odagawa et al. |
| 6,458,603 | B1 | 10/2002 | Kersch et al. |
| 6,493,197 | B2 | 12/2002 | Ito et al. |
| 6,522,137 | B1 | 2/2003 | Sun et al. |
| 6,532,164 | B2 | 3/2003 | Redon et al. |
| 6,538,918 | B2 | 3/2003 | Swanson et al. |
| 6,545,906 | B1 | 4/2003 | Savtchenko et al. |
| 6,563,681 | B1 | 5/2003 | Sasaki et al. |
| 6,566,246 | B1 | 5/2003 | deFelipe et al. |
| 6,603,677 | B2 | 8/2003 | Redon et al. |
| 6,653,153 | B2 | 11/2003 | Doan et al. |
| 6,654,278 | B1 | 11/2003 | Engel et al. |
| 6,677,165 | B1 | 1/2004 | Lu et al. |
| 6,710,984 | B1 | 3/2004 | Yuasa et al. |
| 6,713,195 | B2 | 3/2004 | Wang et al. |
| 6,714,444 | B2 | 3/2004 | Huai et al. |
| 6,744,086 | B2 | 6/2004 | Daughton et al. |
| 6,750,491 | B2 | 6/2004 | Sharma et al. |
| 6,765,824 | B2 | 7/2004 | Kishi et al. |
| 6,772,036 | B2 | 8/2004 | Eryurek et al. |
| 6,773,515 | B2 | 8/2004 | Li et al. |
| 6,777,730 | B2 | 8/2004 | Daughton et al. |
| 6,785,159 | B2 | 8/2004 | Tuttle |
| 6,812,437 | B2 | 11/2004 | Levy et al. |
| 6,829,161 | B2 | 12/2004 | Huai et al. |
| 6,835,423 | B2 | 12/2004 | Chen et al. |
| 6,838,740 | B2 | 1/2005 | Huai et al. |
| 6,842,317 | B2 | 1/2005 | Sugita et al. |
| 6,847,547 | B2 | 1/2005 | Albert et al. |
| 6,887,719 | B2 | 5/2005 | Lu et al. |
| 6,888,742 | B1 | 5/2005 | Nguyen et al. |
| 6,902,807 | B1 | 6/2005 | Argoitia et al. |
| 6,906,369 | B2 | 6/2005 | Ross et al. |
| 6,920,063 | B2 | 7/2005 | Huai et al. |
| 6,933,155 | B2 | 8/2005 | Albert et al. |
| 6,958,927 | B1 | 10/2005 | Nguyen et al. |
| 6,967,863 | B2 | 11/2005 | Huai |
| 6,980,469 | B2 | 12/2005 | Kent et al. |
| 6,985,385 | B2 | 1/2006 | Nguyen et al. |
| 6,992,359 | B2 | 1/2006 | Nguyen et al. |
| 6,995,962 | B2 | 2/2006 | Saito et al. |
| 7,002,839 | B2 | 2/2006 | Kawabata et al. |
| 7,005,958 | B2 | 2/2006 | Wan |
| 7,006,375 | B2 | 2/2006 | Covington |
| 7,009,877 | B1 | 3/2006 | Huai et al. |
| 7,041,598 | B2 | 5/2006 | Sharma |
| 7,045,368 | B2 | 5/2006 | Hong et al. |
| 7,149,106 | B2 | 12/2006 | Mancoff et al. |
| 7,170,778 | B2 | 1/2007 | Kent et al. |
| 7,190,611 | B2 | 3/2007 | Nguyen et al. |
| 7,203,129 | B2 | 4/2007 | Lin et al. |
| 7,227,773 | B1 | 6/2007 | Nguyen et al. |
| 7,262,941 | B2 | 8/2007 | Li et al. |
| 7,307,876 | B2 | 12/2007 | Kent et al. |
| 7,324,387 | B1 | 1/2008 | Bergemont et al. |
| 7,335,960 | B2 | 2/2008 | Han et al. |
| 7,351,594 | B2 | 4/2008 | Bae et al. |
| 7,352,021 | B2 | 4/2008 | Bae et al. |
| 7,376,006 | B2 | 5/2008 | Bednorz et al. |
| 7,378,699 | B2 | 5/2008 | Chan et al. |
| 7,449,345 | B2 | 11/2008 | Horng et al. |
| 7,476,919 | B2 | 1/2009 | Hong et al. |
| 7,502,249 | B1 | 3/2009 | Ding |
| 7,573,737 | B2 | 8/2009 | Kent et al. |
| 7,598,555 | B1 | 10/2009 | Papworth-Parkin |
| 7,619,431 | B2 | 11/2009 | DeWilde et al. |
| 7,630,232 | B2 | 12/2009 | Guo |
| 7,643,332 | B2 | 1/2010 | Leuschner |
| 7,679,155 | B2 | 3/2010 | Korenivski |
| 7,911,832 | B2 | 3/2011 | Kent et al. |
| 7,936,595 | B2 | 5/2011 | Han et al. |
| 7,986,544 | B2 | 7/2011 | Kent et al. |
| 8,014,193 | B2 | 9/2011 | Nakayama et al. |
| 8,279,663 | B2 | 10/2012 | Nakayama et al. |
| 8,279,666 | B2 | 10/2012 | Dieny et al. |
| 8,334,213 | B2 | 12/2012 | Mao |
| 8,357,982 | B2 * | 1/2013 | Kajiyama ............ H01L 27/228 257/421 |
| 8,363,465 | B2 | 1/2013 | Kent et al. |
| 8,456,883 | B1 * | 6/2013 | Liu ................ H01L 21/823475 257/369 |
| 8,488,375 | B2 | 7/2013 | Saida et al. |
| 8,492,881 | B2 | 7/2013 | Kuroiwa et al. |
| 8,508,979 | B2 | 8/2013 | Saida et al. |
| 8,535,952 | B2 | 9/2013 | Ranjan et al. |
| 8,574,928 | B2 | 11/2013 | Satoh et al. |
| 8,576,616 | B2 | 11/2013 | Saida et al. |
| 8,582,355 | B2 | 11/2013 | Saida et al. |
| 8,617,408 | B2 | 12/2013 | Balamane |
| 8,716,817 | B2 | 5/2014 | Saida et al. |
| 8,737,122 | B2 | 5/2014 | Saida et al. |
| 8,737,137 | B1 | 5/2014 | Choy et al. |
| 8,779,537 | B2 | 7/2014 | Huai |
| 8,823,118 | B2 | 9/2014 | Horng |
| 8,852,760 | B2 | 10/2014 | Wang et al. |
| 8,860,156 | B2 | 10/2014 | Beach |
| 8,878,317 | B2 | 11/2014 | Daibou et al. |
| 9,019,754 | B1 | 4/2015 | Bedeschi |
| 9,025,368 | B2 | 5/2015 | Saida et al. |
| 9,082,888 | B2 | 7/2015 | Kent et al. |
| 9,117,995 | B2 | 8/2015 | Daibou et al. |
| 9,159,342 | B2 | 10/2015 | Kudo et al. |
| 9,245,608 | B2 | 1/2016 | Chen et al. |
| 9,263,667 | B1 | 2/2016 | Pinarbasi |
| 9,299,918 | B2 | 3/2016 | Daibou et al. |
| 9,337,412 | B2 | 3/2016 | Pinarbasi et al. |
| 9,362,486 | B2 | 6/2016 | Kim et al. |
| 9,378,817 | B2 | 6/2016 | Lee et al. |
| 9,379,314 | B2 | 6/2016 | Park |
| 9,406,876 | B2 | 8/2016 | Pinarbasi |
| 9,472,282 | B2 | 10/2016 | Lee et al. |
| 9,472,748 | B2 | 10/2016 | Kuo et al. |
| 9,484,527 | B2 | 11/2016 | Han et al. |
| 9,548,445 | B2 | 1/2017 | Lee et al. |
| 9,589,616 | B2 | 3/2017 | Meng et al. |
| 9,728,712 | B2 | 8/2017 | Kardasz et al. |
| 9,741,926 | B1 | 8/2017 | Pinarbasi et al. |
| 9,773,540 | B2 | 9/2017 | Zang et al. |
| 9,773,974 | B2 | 9/2017 | Pinarbasi et al. |
| 9,777,974 | B2 * | 10/2017 | Kamitani ............ F04B 43/046 |
| 9,853,206 | B2 * | 12/2017 | Pinarbasi ................ H01L 43/08 |
| 10,008,248 | B2 * | 6/2018 | Buhrman ................ H01L 43/08 |
| 10,026,892 | B2 * | 7/2018 | Pinarbasi ................ H01L 43/08 |
| 10,032,978 | B1 | 7/2018 | Schabes et al. |
| 2002/0090533 | A1 | 7/2002 | Zhang et al. |
| 2002/0105823 | A1 | 8/2002 | Redon et al. |
| 2002/0132140 | A1 | 9/2002 | Igarashi et al. |
| 2003/0117840 | A1 | 6/2003 | Sharma et al. |
| 2003/0151944 | A1 | 8/2003 | Saito |
| 2003/0197984 | A1 | 10/2003 | Inomata et al. |
| 2003/0218903 | A1 | 11/2003 | Luo |
| 2004/0012994 | A1 | 1/2004 | Slaughter et al. |
| 2004/0061154 | A1 | 4/2004 | Huai et al. |
| 2004/0094785 | A1 | 5/2004 | Zhu et al. |
| 2004/0125649 | A1 | 7/2004 | Durlam et al. |

(56) References Cited

U.S. PATENT DOCUMENTS

| | | |
|---|---|---|
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1* | 6/2008 | Guo .................. G11C 11/16 365/171 |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1* | 9/2011 | Igarashi .................. G11B 5/314 360/61 |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1* | 12/2015 | Kent .................. G11C 11/16 365/158 |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1* | 9/2016 | Ralph .................. G11C 11/18 |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0236570 A1* | 8/2017 | Kent .................. G11C 11/161 365/158 |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |
| 2018/0248110 A1 | 8/2018 | Kardasz et al. |
| 2018/0248113 A1 | 8/2018 | Pinarbasi et al. |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |

(56) References Cited

FOREIGN PATENT DOCUMENTS

| | | |
|---|---|---|
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-524830 A | 7/2008 |
| JP | 2009-027177 A | 2/2009 |
| JP | 2013-012546 A | 1/2013 |
| JP | 2013-219010 A | 10/2013 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 A | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2014-062681 A1 | 4/2014 |
| WO | WO-2015-153142 A1 | 10/2015 |
| WO | 2016011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |

OTHER PUBLICATIONS

International Search Report and Written Opinion dated May 30, 2018 in PCT/US2018/014641; 13 pages.
Final Office Action dated Jul. 9, 2015 in U.S. Appl. No. 14/242,419; 19 pages.
Final Office Action dated Jun. 9, 2017 in U.S. Appl. No. 14/814,038; 19 pages.
Final Office Action dated Aug. 2, 2018 in U.S. Appl. No. 15/674,620.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 9, 2017 in U.S. Appl. No. 14/866,359; 26 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
Notice of Allowance dated Sep. 26, 2018 in U.S. Appl. No. 15/859,047; 10 pages.
Notice of Allowance dated Oct. 24, 2018 in U.S. Appl. No. 15/859,517.
Office Action dated Aug. 30, 2018 in Chinese Patent Application No. 201580009984.2.
Office Action dated Oct. 9, 2018 in Japanese Patent Application No. 2016-526761.
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.
Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.
S. Ikeda, et al.; "A perpendicular-anisotropy CoFeB—MgO magnetic tunnel junction"; Nature Materials, vol. 9, Sep. 2010; pp. 721-724; 4 pages.
Soo-Man Seo, et al.; "Current-induced synchronized switching of magnetization;" Applied Physics Letters 101; 2012 American Institute of Physics; Aug. 7, 2012; 6 pages.
Kent, et al.; U.S. Appl. No. 61/715,111, filed Oct. 17, 2012, entitled "Inverted Orthogonal Spin Transfer Layer Stack".
Pinarbasi, et al.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled "Magnetic Tunnel Junction Structure for MRAM Device".
International Search Report and Written Opinion dated Jul. 10, 2015 in PCT/US2015/021580; 12 pages.
Pinarbasi, et al.; U.S. Appl. No. 14/814,036, filed Jul. 30, 2015, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
International Search Report and Written Opinion dated Apr. 7, 2017 in PCT/US2016/067444; 13 pages.

(56) References Cited

OTHER PUBLICATIONS

Notice of Allowance dated Apr. 21, 2017 in U.S. Appl. No. 15/157,783; 36 pages.

Pinarbasi, et al.; U.S. Appl. No. 15/656,398, filed Jul. 21, 2017, entitled "Memory Cell Having Magnetic Tunnel Junction and Thermal Stability Enhancement Layer".

Kardasz, et al.; U.S. Appl. No. 15/657,498, filed Jul. 24, 2017, entitled "Spin Transfer Torque Structure for MRAM Devices Having a Spin Current Injection Capping Layer".

Notice of Allowance dated Jul. 27, 2017 in U.S. Appl. No. 15/097,576; 22 pages.

Pinarbasi, et al.; U.S. Appl. No. 15/674,620, filed Aug. 11, 2017, entitled "Polishing Stop Layer(s) for Processing Arrays of Semiconductor Elements".

Schabes, et al.; U.S. Appl. No. 15/634,629, filed Jun. 27, 2017, entitled "MRAM with Reduced Stray Magnetic Fields".

Notice of Allowance dated Oct. 16, 2017 in U.S. Appl. No. 14/814,036; 16 pages.

Pinarbasi, et al.; U.S. Appl. No. 15/794,871, filed Oct. 26, 2017, entitled "Precessional Spin Current Structure for MRAM".

Tzoufras, et al.; U.S. Appl. No. 15/858,950, filed Dec. 29, 2017, entitled "AC Current Pre-Charge Write-Assist in Orthogonal STT-MRAM".

Gajek, et al.; U.S. Appl. No. 15/858,988, filed Dec. 29, 2017, entitled "Self-Generating AC Current Assist in Orthogonal STT MRAM".

Ryan, et al.; U.S. Appl. No. 15/859,015, filed Dec. 29, 2017, entitled "Shared Oscillator (STNO) for MRAM Array Write-Assist in Orthogonal STT-MRAM".

Tzoufras, et al.; U.S. Appl. No. 15/859,030, filed Dec. 29, 2017, entitled "AC Current Write-Assist in Orthogonal STT-MRAM".

Bozdag, et al.; U.S. Appl. No. 15/859,047, filed Dec. 29, 2017, entitled "Three-Terminal MRAM with AC Write-Assist for Low Read Disturb".

Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".

Schabes, et al.; U.S. Appl. No. 15/859,384, filed Dec. 30, 2017, entitled "Perpendicular Magnetic Tunnel Junction Device with Skyrmionic Assist Layers for Free Layer Switching".

Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".

Schabes, et al.; U.S. Appl. No. 15/859,379, filed Dec. 30, 2017, entitled "Perpendicular Magnetic Tunnel Junction Device with Offset Precessional Spin Current Layer".

Schabes, et al.; U.S. Appl. No. 15/859,374, filed Dec. 30, 2017, entitled "Switching and Stability Control for Perpendicular Magnetic Tunnel Junction Device".

El Baraji, et al.; U.S. Appl. No. 15/859,517, filed Dec. 30, 2017, entitled "Microwave Write-Assist in Series-Interconnected Orthogonal STT-MRAM Devices".

* cited by examiner

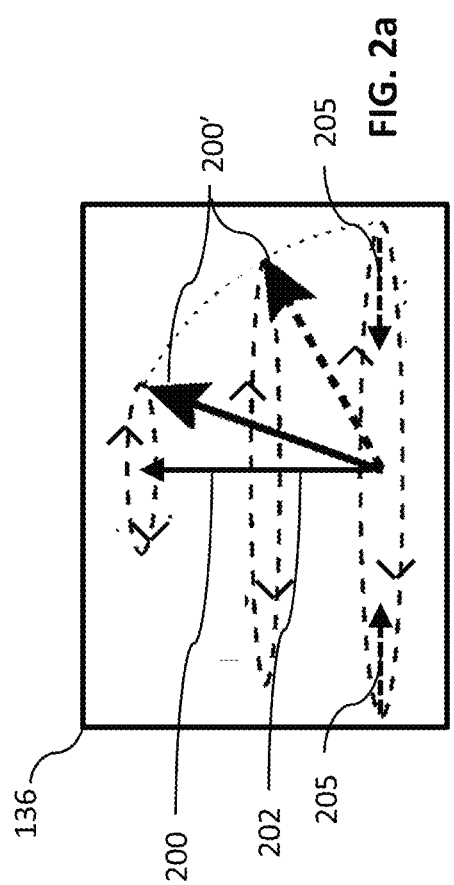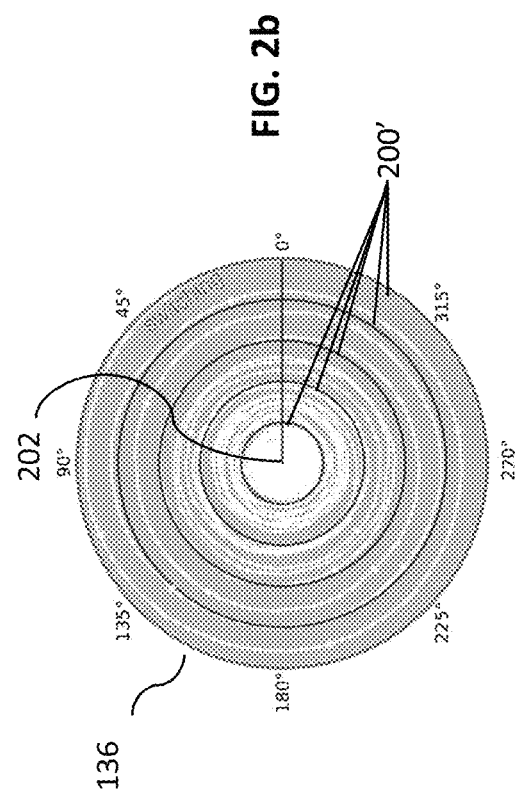

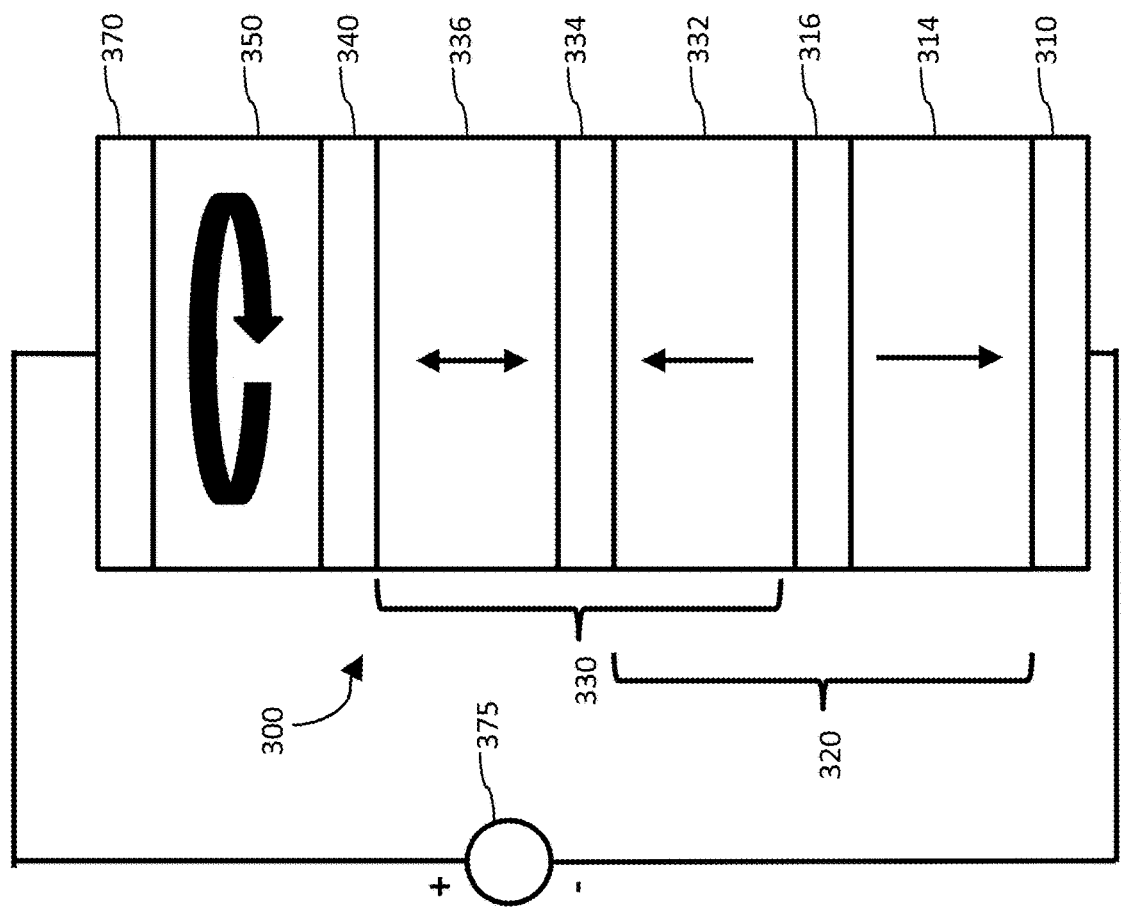

MICROWAVE WRITE-ASSIST IN ORTHOGONAL STT-MRAM

FIELD

The present patent document relates generally to spin-transfer torque magnetic random access memory and, more particularly, to a magnetic tunnel junction stack having improved performance of the free layer in the magnetic tunnel junction structure.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer(s) and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction ("MTJ"). In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

When a current is passed through a magnetic layer (e.g., a polarizer), the spin orientation of the electrons that flow out of the magnetic layer is generally aligned in the direction of the magnetization of the magnetic layer and will exert a spin-transfer torque in that direction (forming a transverse spin current) upon impinging on another magnetic layer. However, due to the conservation of angular moment for the system, the electrons on the opposite side of magnetic layer, those that do not go through the magnetic layer, generally have a spin orientation that is aligned in the direction that is anti-parallel to the magnetization direction of the magnetic layer. The net effect of this process is that the current applied to the magnetic layer undergoes spin filtering, which creates a spin current on one side of the magnetic layer, with spins that are aligned with magnetization direction of the magnetic layer, and a reflected spin current on the other side of the magnetic layer, with spins that are anti-parallel to the magnetization direction of the magnetic layer. This effect occurs upon application of a current to any magnetic layer, including an in-plane polarization layer or an out-of-plane reference magnetic layer. Thus, in a typical MTJ, when switching the magnetization direction of the free layer in one direction (e.g., from the parallel to anti-parallel state) is achieved using spin transfer torque from the transverse spin current, switching the free layer in the other direction (e.g., from the anti-parallel to parallel states) would be achieved using spin transfer torque from the reflected spin current. This is typically accomplished by running electrical current through the MTJ in one direction when switching from the anti-parallel to parallel state and running the electrical current through the MTJ in the other direction when switching from the parallel to anti-parallel state.

FIG. 1 illustrates a MTJ stack 100 for an MRAM device including a magnetic tunnel junction MTJ 130 and a top polarizer layer 150. As shown, stack 100 includes one or more seed layers 110 provided at the bottom of stack 100 to initiate a desired crystalline growth in the above-deposited layers. Furthermore, MTJ 130 is deposited on top of Synthetic Anti-Ferromagnetic (SAF) layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has an antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Polarizer 150 polarizes the current in a direction perpendicular (orthogonal) to those of the magnetizations of the free magnetic layer 136 and reference magnetic layer 132. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a combination of reactive ion etch (RIE) and ion beam etching (IBE) processes.

Various mechanisms have been proposed to assist the free-layer magnetization switching in MTJ devices. One issue has been that to realize the orthogonal spin transfer effect for in-plane MTJ structures, large spin currents may be required for switching. The need for large switching currents may limit such device's commercial applicability. One way proposed to reduce switching current is to lower the magnetization of the free layer. However, if the effective magnetization of the free layer is lowered significantly, the orthogonal effect has to be limited so that the free-layer does not go into precessional mode that would make the end state of the free-layer magnetization un-deterministic. This defines the operation window for the in-plane OST structures. In an in-plane device, unlike that shown in FIG. 1, the magnetization direction of the reference layer and free layer are in the plane of the layer. Another aspect of in-plane devices is that the thermal stability requirements may limit the size of the MTJ devices to approximately sixty nanometers or higher.

In contrast to MTJ structures with an in-plane free layer and perpendicular polarizer perpendicular MTJ structures such as those shown in FIG. 1, are less prone to getting into a pure precessional regime. This is due to the fact that in perpendicular MTJ structures, the direction of the demagnetization field and perpendicular anisotropy contributions are the same. In this case the precession is generally not an issue and the end-state is more deterministic. However, precession may be an issue with regards to read disturb, particularly when stronger read currents are used. The orthogonal polarizer acts on the free layer magnetization at the initial state, but when the precession takes hold, the fixed orthogonal polarizer 150 helps only half the cycle of the free-layer magnetization rotation while it harms the other half of the cycle. This is demonstrated with reference to FIGS. 2-3. FIGS. 2a-2b shows switching of a free layer 136 of an MTJ. As is seen, free layer 136 has a magnetization direction 200 perpendicular to that of the polarizer 150. The magnetization direction 200 of the free layer 136 can rotate by 180 degrees. FIGS. 2a-2b show precession about the axis of the magnetization vector of free layer 136. During precession, magnetic vector 200 begins to rotate about its axis in a cone-like manner such that its magnetization vector 200' deflects from the perpendicular axis 202 of free layer 136. Whereas prior to initiating precession, no component of magnetic vector 200 is in the plane of free layer 136, once precession starts, a component of magnetic vector 200' can be found both in-plane and orthogonal to free layer 136. As magnetic vector 200' continues to precess (i.e., switch), the rotation of vector 200' extends further from the center of free layer 136, as is seen in FIG. 2b.

In most prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2a as well as FIG. 3). Axis 202 is perpendicular to the plane of free layer 136. This damping 205 has value, defined by the damping constant, which maintains the magnetization direction of the free layer 136.

The precession of the magnetization vector during switching of the free layer can be assisted by spin transfer torque exerted by the electrons of a spin-polarized current, which is generated in part by the orthogonal polarizer 150. Applying a voltage across the MTJ device 100 produces a charge current through the device. This charge current, in turn, produces a spin-polarized current via spin filtering through the magnetic layers of the device (i.e., the orthogonal polarizer 150 and the reference layer 132). The spin-polarized electrons of the spin-polarized current exerts a spin transfer torque on the magnetic vector 200. This spin transfer torque has an in-plane component of the spin transfer torque 210, which pushes magnetization vector 200' in the direction of the magnetic vector of polarizer 150 throughout precession of magnetic vector 200'. In addition to the in-plane spin transfer torque 210 from the polarizer, the perpendicular spin transfer torque (not shown), generated by reference layer 132, pulls the magnetic vector 200' towards the direction antiparallel to its initial direction 200, thereby causing switching of the free layer 136. In devices like those shown in FIG. 1, when the spin transfer torque 210 begins to help overcome the damping 205 inherent to the free layer 136, the magnetic direction 200' begins to precess about its axis, as shown in FIG. 2a. As seen in FIG. 3, in-plane spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e., it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

FIG. 3 illustrates precession of a free layer 136 of an MTJ assisted by orthogonal spin polarized current. The spin polarized electrons from polarizer 150 provide a spin transfer torque which has a component 210 in the plane of the precession (i.e., in-plane spin transfer torque) that helps overcome the damping 205 in the first half of the precession 215 because the in-plane spin transfer torque 210 provided by the spin polarized current is opposite that of the inherent damping 205 of the free layer 136. This is shown on the right-hand side of the middle portion of FIG. 3, which illustrates the projection of spin transfer torque 210 onto the precession plane (i.e., the plane defined by axis 200 and magnetization vector 200' as it steadily precesses around axis 200). However, the in-plane spin transfer torque actually harms the switching process during the second half of the precession 220. The reason for this is that the spin of the electrons in the spin polarized current only apply an in-plane spin transfer torque 210 in the direction of their polarization, which is aligned with the magnetic direction of the in-plane polarization layer 150. Thus, when the magnetic vector is in the half of the precession cycle 220 that is opposite the spin of the polarized electrons, the in-plane spin transfer torque 210 actually works with the inherent damping 205 of free layer 136 to make rotation more difficult. This is shown in the left-hand side of the middle portion of FIG. 3 and can be seen in the projection of the spin transfer torque 210 onto the precessional plane of the free layer 136, which is depicted on the bottom of FIG. 3. Indeed, it is the perpendicular spin transfer torque created by the reference layer 132 (not shown in FIG. 3) that overcomes the damping 205 of free layer 136 as well as the in-plane spin transfer torque 210 during the half of a precession cycle where the spin of the electrons harms precession, and thus it is the reference layer 132 that allows for completion of precession. The precessional dynamics and the directionality of the spin transfer torque depicted in FIG. 3 are merely approximations at small magnetization polar angles and do not necessarily reflect the phenomena occurring at larger magnetization polar angles. However, the precessional dynamics that occur when the magnetization vector of the free layer 132 is at small magnetization polar angles are, to a large extent, determinative of the efficiency of the switching process.

One solution that has been proposed to overcome this limitation is the use of a precessional spin current ("PSC") magnetic layer having a magnetization vector that can freely rotate in any magnetic direction, shown in FIG. 4a-b. The free layer 336 is similar to the free layer 136 previously discussed, in that it has an inherent damping characteristic 205 that can be overcome with the assistance of spin transfer torque. However, the polarizing layer 150 is replaced with a precessional magnetic layer 350. As seen in FIG. 4a, which shows the projection onto the precessional plane of the direction of the spin transfer torque 410 created by spin current passing through free layer 336, the direction of spin transfer torque 410 changes with the rotation of PSC magnetic layer 350. As seen on the right side of FIG. 4a, spin transfer torque 410 causes the magnetization direction 200' of the free layer 336 to precess in a cone-like manner around an axis 202 perpendicular to the plane of the layers. The PSC layer 350 and the free-layer 336 are magnetically and/or electronically coupled such that the magnetization direction of the magnetization vector 270 of the PSC magnetic layer 350 follows the precessional rotation of the magnetic vector of the free layer 336. Thus, at all times, the magnetization vector of the PSC layer 350 follows the precessional motion of the magnetization vector of the free layer 336. This is true whether the free layer is being switched from the parallel state to the antiparallel state or from the antiparallel state to the parallel state.

As seen in on the right-hand side of FIG. 4a, the spin polarized electrons provide torque 410 that helps to overcome the damping 205 in the first half of the precession 215 because the torque 410 provided by the spin polarized current is opposite that of the inherent damping 205 of the free layer 336. In addition, torque 410 helps to overcome the damping 205 in the second half of the precession 220 by the same mechanism. Thus, unlike prior devices having a fixed polarization magnetic layer 150, the spin of the electrons in the spin polarized current applies a torque 410 in both halves of the precession cycle, including the half of the precession cycle 220 where devices with fixed polarization magnetic layers 150 actually harmed precession. As is seen, the torque 410 continues to help overcome the inherent damping 205 of free layer 136 throughout the entire precession cycle. An MRAM device utilizing an MTJ structure with a PSC is depicted in FIG. 5.

However, because of the chirality of perpendicular MTJ structures that utilize a PSC, such as the structure shown in FIG. 5, the PSC only enhances switching of the free layer in one direction (i.e., from the parallel state to the anti-parallel state, FIG. 4a), but not the other (i.e., from the antiparallel state to the parallel state, FIG. 4b). As discussed above, when switching the free layer 336 from the first direction to the second direction, the spin current is generated by the electrons passing through the PSC layer and the in-plane spin transfer torque 410 is in line with the magnetic vector of the PSC layer (FIG. 4a). However, during switching free layer 336 from the second direction to the first direction, it is the reflected spin current from PSC layer that imparts the in-plane spin transfer torque 411 on the free layer 336. As shown in FIG. 4b, the in-plane spin transfer torque 411 caused by the reflected spin current is in the direction anti-parallel to the magnetic vector 270 of the PSC layer 350. When the magnetic vector 270 is aligned with the magnetic vector 200, the in-plane spin transfer torque 411 might actually enhance the damping characteristic 205 of the free layer 336. Therefore, when the precession of magnetic vector 270 of the PSC layer 350 is synchronized with the precession of the magnetic vector 200 of the free layer 336, the in-plane spin transfer torque 411 might enhance the damping characteristic 205 throughout the entire precession 220'. Because the PSC layer 350 and the free layer 336 are magnetically and/or electronically coupled, the precession of magnetization vector 270 and magnetization vector 200 are synchronized during switching in both directions. Thus, the PSC layer can be highly effective at increasing the switching efficiency of the free layer in one direction, but may actually hamper switching in the other direction.

Thus, in prior devices that utilize in-plane polarization layers having a fixed magnetization direction and having a free magnetic layer 150 that is perpendicular to the plane of the device, once the precession holds, the in-plane spin transfer torque has no net positive effect on the switching mechanism for a full three hundred sixty degree precession. Moreover, in prior devices that utilize a PSC magnetic layer 350, the in-plane spin transfer torque enhances the switching of the free layer 336 throughout the precession from the first direction to the second direction, but might not enhance the switching of the free layer 336 from the second direction to the first direction. This is due at least in part to the magnetic and/or electronic coupling between the PSC layer 350 and free layer 336.

Therefore, there is a need for a spin torque transfer device that reduces the amount of current needed for switching from both magnetization directions while also switching at high speeds and requiring reduced chip area.

SUMMARY

An MRAM device is disclosed that has a magnetic tunnel junction stack having a significantly improved performance of the free layer in the magnetic tunnel junction structure that requires significantly lower switching currents and which significantly reduces switching times for MRAM applications and maintains this characteristic for both switching directions (AP to P and P to AP)

In one embodiment, a magnetic device includes a reference magnetic layer in a first plane. The reference magnetic layer has a magnetization vector that is perpendicular to the first plane and has a fixed magnetization direction. The magnetic device also has a non-magnetic tunnel barrier layer in a second plane and disposed over the reference magnetic layer. The magnetic device also includes a free magnetic layer in a third plane and disposed over the non-magnetic tunnel barrier layer. The free magnetic layer has a magnetization vector that is perpendicular to the third plane and has a magnetization direction that can switch from a first magnetization direction to a second magnetization direction and from the second magnetization direction to the first magnetization direction. The switching process involves precessions at a precession radius around an axis perpendicular to the first plane, and the magnetization vector of the free magnetic layer has a predetermined precession frequency. The reference magnetic layer, the non-magnetic tunnel barrier layer, and the free magnetic layer form a magnetic tunnel junction (MTJ). The magnetic device also includes a non-magnetic spacer in a fourth plane and disposed over the free magnetic layer. The magnetic device also includes an inducible precessional magnetic layer in a fifth plane and disposed over the non-magnetic spacer. The inducible precessional magnetic layer has a magnetization vector with a magnetization component in the fifth plane that rotates at an induced rotation frequency in the presence of an external alternating magnetic field. The magnetization vector of the inducible precessional magnetic layer is fixed in the absence of the external alternating magnetic field. The magnetic device also includes an external wire that is physically separate from the MTJ, the non-magnetic spacer and the inducible precessional magnetic layer. The external wire generates the external alternating magnetic field upon direction of an alternating current through the external wire. The external wire is proximate to the inducible precessional magnetic layer, thereby enabling the external alternating magnetic field to induce rotation of the magnetization vector of the inducible precessional magnetic layer. The magnetic device also includes a first current source that is physically separate from the MTJ, the non-magnetic spacer and the inducible precessional magnetic layer. The first current source directs an alternating current through the external wire, thereby generating the external alternating magnetic field. The magnetic device also includes a second current source that directs a programming current through the inducible precessional magnetic layer, the non-magnetic spacer, and the MTJ. Application of the programming current to the inducible precessional magnetic layer, the non-magnetic spacer, and the MTJ produces a spin-polarized current having spin-polarized electrons. The spin-polarized electrons exert a spin transfer torque on the magnetization vector of the free magnetic layer. The direction of the spin transfer torque determined in part by the direction of the magnetization vector of the inducible precessional magnetic layer. The induced rotation frequency is synchronized with the predetermined precession frequency of the free magnetic layer, thereby causing spin transfer torque to assist switching of the magnetization vector of the free magnetic layer from the first magnetization direction to the second magnetization direction and from the second magnetization direction to the first magnetization direction. In this way, the efficiency of the switching process of the free magnetic layer is improved from the first magnetization direction to the second magnetization direction and from the second magnetization direction to the first magnetization direction.

In another embodiment, a difference in frequency between the induced rotation frequency and the predetermined precession frequency of the free magnetic layer is less than twenty percent of the predetermined precession frequency of the free magnetic layer.

In another embodiment, a difference in frequency between the induced rotation frequency and the predetermined precession frequency of the free magnetic layer is less than ten percent of the predetermined precession frequency of the free magnetic layer.

In another embodiment, a difference in frequency between the induced rotation frequency and the predetermined precession frequency of the free magnetic layer is less than five percent of the predetermined precession frequency of the free magnetic layer.

In another embodiment, a difference in frequency between the induced rotation frequency and the predetermined precession frequency of the free magnetic layer is less than two percent of the predetermined precession frequency of the free magnetic layer.

In another embodiment, the external alternating magnetic field exerts a force on the magnetization vector of the free magnetic layer, thereby assisting in the switching of the magnetization direction of the free magnetic layer.

In another embodiment, the external alternating magnetic field enhances the precession of the magnetization vector of the free magnetic layer.

In another embodiment, the programming current comprises a direct current.

In another embodiment, switching the magnetization direction of the free magnetic layer requires both the first current source directing the alternating current through the external wire and the second current source directing the electrical current through the inducible precessional magnetic layer, the non-magnetic spacer, the free magnetic layer, the non-magnetic tunnel barrier layer, and the reference magnetic layer.

In another embodiment, switching the magnetization direction of the free magnetic layer requires the magnetization vector of the inducible precessional magnetic layer to rotate at the induced rotation frequency.

In another embodiment, switching the magnetization direction of the free magnetic layer requires generating the external alternating magnetic field.

In another embodiment, the inducible precessional magnetic layer has a weak in-plane anisotropy.

In another embodiment, the inducible precessional magnetic layer comprises CoFeB.

In another embodiment, the non-magnetic spacer comprises MgO.

In another embodiment, the non-magnetic spacer has a thickness that prevents coupling of the free magnetic layer to the inducible precessional magnetic layer.

In another embodiment, a magnetic device includes a magnetic tunnel junction (MTJ) in a first plane. The MTJ comprises a reference magnetic layer, a non-magnetic tunnel barrier layer, and a free magnetic layer. The free magnetic layer and the reference magnetic layer are separated by the non-magnetic tunnel barrier layer. The reference magnetic layer has a magnetization vector that is perpendicular to the first plane and has a fixed magnetization direction. The free magnetic layer has a magnetization vector that is perpendicular to the first plane and has a magnetization direction that can switch from a first magnetization direction to a second magnetization direction and from the second magnetization direction to the first magnetization direction. The switching process involves precessions at a precession radius around an axis perpendicular to the first plane, and the magnetization vector of the free magnetic layer has a predetermined precession frequency. The magnetic device also includes a non-magnetic spacer in a second plane. The non-magnetic spacer separates the MTJ from an inducible precessional magnetic layer. The magnetic device also includes the inducible precessional magnetic layer in a third plane and coupled to the non-magnetic spacer. The inducible precessional magnetic layer has a magnetization vector with a magnetization component in the third plane that rotates at an induced rotation frequency in the presence of an external alternating magnetic field. The magnetization vector of the inducible precessional magnetic layer is fixed in the absence of the external alternating magnetic field. The magnetic device also includes an external wire that is physically separate from the MTJ, the non-magnetic spacer and the inducible precessional magnetic layer. The external wire generates the external alternating magnetic field upon direction of an alternating current through the external wire. The external wire is proximate to the inducible precessional magnetic layer, thereby enabling the external alternating magnetic field to induce rotation of the magnetization vector of the inducible precessional magnetic layer. Application of a programming current to the inducible precessional magnetic layer, the non-magnetic spacer, and the MTJ produces a spin-polarized current having spin-polarized electrons. The spin-polarized electrons exert a spin transfer torque on the magnetization vector of the free magnetic layer. The direction of the spin transfer torque is in part determined by the direction of the magnetization vector of the inducible precessional magnetic layer. The induced rotation frequency is synchronized with the predetermined precession frequency of the free magnetic layer, thereby causing spin transfer torque to assist switching of the magnetization vector of the free magnetic layer from the first magnetization direction to the second magnetization direction and from the second magnetization direction to the first magnetization direction. In this way, the efficiency of the switching process of the free magnetic layer is improved from the first magnetization direction to the second magnetization direction and from the second magnetization direction to the first magnetization direction.

In another embodiment, the magnetic device also includes a first current source that is physically separate from the MTJ, the non-magnetic spacer and the inducible precessional magnetic layer The first current source directs the alternating current through the external wire, thereby generating the external alternating magnetic field. The magnetic device also includes a second current source that directs the programming current through the inducible precessional magnetic layer, the non-magnetic spacer, and the MTJ.

In another embodiment, a magnetic device includes an inducible precessional magnetic layer in a first plane. The inducible precessional magnetic layer has a magnetization vector with a magnetization component in the first plane that rotates at an induced rotation frequency in the presence of an external alternating magnetic field. The magnetization vector of the inducible precessional magnetic layer is fixed in the absence of the external alternating magnetic field. The magnetic device also includes a non-magnetic spacer in a second plane and disposed over the inducible precessional magnetic layer. The magnetic device also includes a free magnetic layer in a third plane and disposed over the non-magnetic spacer. The free magnetic layer has a magnetization vector that is perpendicular to the third plane and has a magnetization direction that can switch from a first magnetization direction to a second magnetization direction and from the second magnetization direction to the first magnetization direction. The switching process involves precessions at a precession radius around an axis perpendicular to the third plane, and the magnetization vector of the free magnetic layer has a predetermined precession frequency. The magnetic device also includes a non-magnetic tunnel barrier layer in a fourth plane and disposed over the free magnetic layer. The magnetic device also includes a reference magnetic layer in a fifth plane and disposed over the non-magnetic tunnel barrier layer. The reference magnetic layer has a magnetization vector that is perpendicular to the fifth plane and has a fixed magnetization direction. The reference magnetic layer, the non-magnetic tunnel barrier layer and the free magnetic layer form a magnetic tunnel junction (MTJ). The magnetic device also includes an external wire that is physically separate from the MTJ, the non-magnetic spacer and the inducible precessional magnetic layer. The external wire generates the external alternating magnetic field upon direction of an alternating current through the external wire. The external wire is proximate to the inducible precessional magnetic layer, thereby enabling the external alternating magnetic field to induce rotation of the magnetization vector of the inducible precessional magnetic layer. The magnetic device also includes a first current source that is physically separate from the MTJ, the non-magnetic spacer and the inducible precessional magnetic layer. The first current source directs an alternating current through the external wire, thereby generating the external alternating magnetic field. The magnetic device also includes a second current source that directs a programming current through the inducible precessional magnetic layer, the non-magnetic spacer, the free magnetic layer, the non-magnetic tunnel barrier layer, and the reference magnetic layer. Application of the programming current to the inducible precessional magnetic layer, the non-magnetic spacer, and the MTJ produces a spin-polarized current having spin-polarized electrons. The spin-polarized electrons exert a spin transfer torque on the magnetization vector of the free magnetic layer. The direction of the spin transfer torque is in part determined by the direction of the magnetization vector of the inducible precessional magnetic layer. The induced rotation frequency is synchronized with the predetermined precession frequency of the free magnetic layer, thereby causing spin transfer torque to assist switching of the magnetization vector of the free magnetic layer from the first magnetization direction to the second magnetization direction and from the second magnetization direction to the first magnetization direction. In this way, the efficiency of the switching process of the free magnetic layer is improved from the first magnetization direction to the second magnetization direction and from the second magnetization direction to the first magnetization direction.

In another embodiment, an external uniform magnetic field is used to set the direction of precession of the inducible precessional magnetic layer.

In another embodiment the fringing fields from the reference layer are used to set the direction of rotation of the inducible precessional magnetic layer.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIGS. 2a-2b illustrates the precession of the free layer in an MTJ.

FIG. 5 illustrates an MTJ stack for an MRAM device having a precessional spin current magnetic layer.

Figure 1:
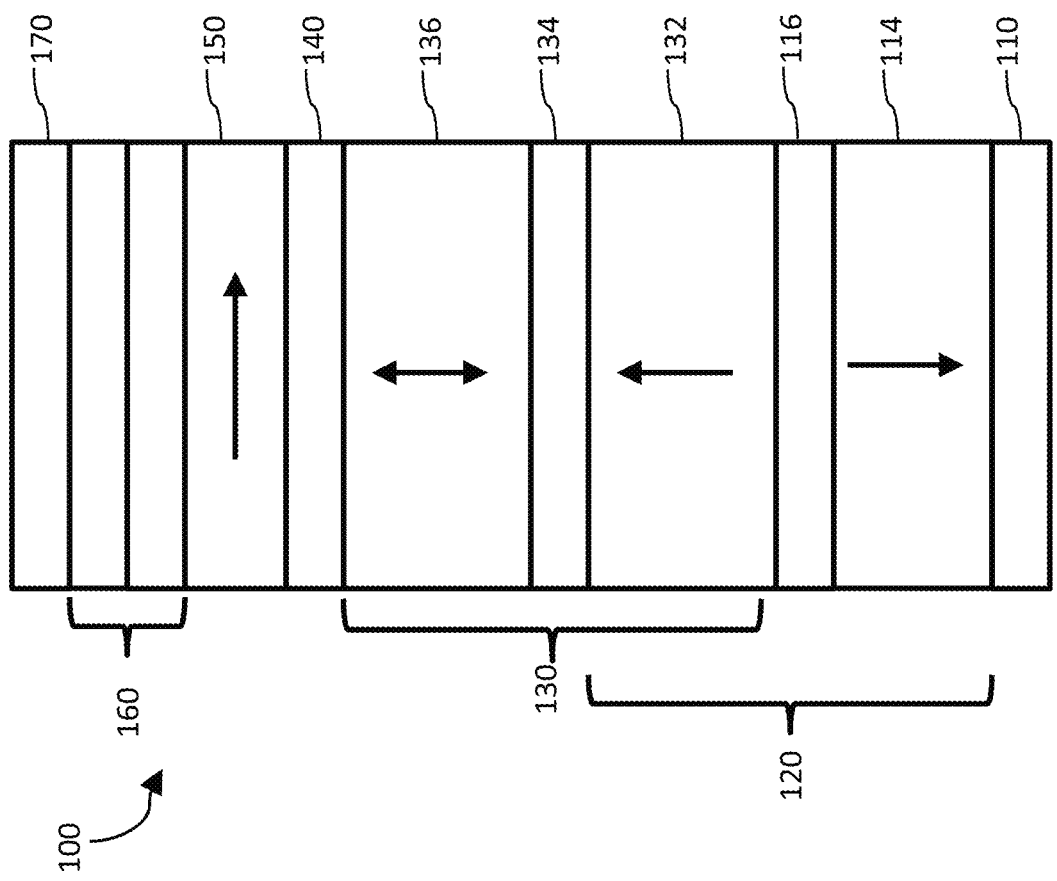
FIG. 1 illustrates a conventional perpendicular MTJ stack with an in-plane polarizer for an MRAM device.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use methods and magnetic devices that utilize an inducible precessional magnetic layer to assist in the switching of a magnetization vector for a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

The present patent document discloses a MRAM device that comprises a perpendicular MTJ and an inducible precessional magnetic layer (i.e., inducible polarizer) that has a magnetization vector that precesses upon exposure to an external alternating magnetic field. This device is described with reference to FIGS. 6-8. The first current source applies a first electrical current comprising an alternating current to an external wire, thereby generating an external alternating magnetic field. The external alternating magnetic field induces precession of magnetization vector of the inducible polarizer at an induced rotation frequency. A second current source directs a programming current pulse through the inducible polarizer and the MTJ during the writing process. Application of this programming current pulse to the inducible polarizer and the MTJ generates a spin-polarized current having spin polarized electrons. The spin-polarized electrons exert a spin transfer torque on the magnetization vector of the free magnetic layer in the direction of the magnetization vector of the inducible polarizer. In some embodiments, the induced rotation frequency is synchronized with the predetermined precession frequency of the magnetization vector of the free layer, thereby causing spin transfer torque to assist switching of the magnetization vector of the free layer.

The present patent document also discloses a method for switching the magnetization vector of a free layer in a magnetic device that comprises a perpendicular MTJ and an inducible polarizer that has a magnetization vector that precesses upon exposure to an external alternating magnetic field. This method comprises generating a first current pulse and applying the first current pulse to an external wire, thereby generating an external alternating magnetic field. The external alternating magnetic field then induces precession of the magnetization vector of the inducible polarizer at an induced rotation frequency. Next, a second current pulse (i.e., a programming current) is generated and applied to the MTJ stack comprising an MTJ and an inducible polarizer. Application of this programming current pulse to the inducible polarizer and the MTJ generates a spin-polarized current having spin polarized electrons. The spin-polarized electrons exert a spin transfer torque on the magnetization vector of the free magnetic layer in the direction of the magnetization vector of the inducible polarizer. In some embodiments, the induced rotation frequency is synchronized with the predetermined precession frequency of magnetization vector of the free layer, thereby causing spin transfer torque to assist switching of the magnetization vector of the free layer.

As described above, when a programming current pulse is applied to the PSC layer 350 and a perpendicular MTJ 330, a spin-polarized current having spin-polarized electrons is formed. Also as described above, when switching the magnetization vector of the free layer 336 from the parallel direction to the antiparallel direction, the spin-polarized electrons exert an in-plane spin transfer torque on the magnetization vector of the free layer 336 that is in the direction of the magnetization vector of the PSC layer 350. However, when switching free layer 336 from the antiparallel direction to the parallel direction, the spin-polarized electrons exert an in-plane spin transfer torque (generated by the reflected spin current from PSC layer 350) on the magnetization vector of free layer 336 that is antiparallel to the direction of the magnetization vector of the PSC layer 350. In devices such as MTJ stack 300, the PSC layer 350 is magnetically and/or electronically coupled with free layer 336 such that the rotation of the magnetization vector of PSC 350 follows the precession of free layer 336. Thus, the in-plane spin transfer torque generated by PSC layer 350 assists during switching from the parallel direction to antiparallel direction (i.e., when the in-plane spin transfer torque is generated from the transverse spin current) but can impede switching from the antiparallel direction to the parallel direction (i.e., when the in-plane spin transfer torque is generated from the reflected spin current).

The various embodiments described herein, such as magnetic device 500, benefit from the advantages of devices comprising PSC layers, but offer at least two additional significant improvements: (1) improved switching efficiency when switching the free layer 536 in both directions (i.e., from parallel to antiparallel and from parallel to antiparallel); and (2) reduced probability of inadvertent free layer switching when reading the resistance across the MTJ stack 560.

Upon application of an electrical current comprising an alternating current to external wire 580, an external alternating magnetic field is generated. The external alternating magnetic field induces the magnetization vector of inducible polarizer 550 to rotate around an axis perpendicular to the plane of the inducible polarizer layer (i.e., precess around a perpendicular axis). In some embodiments, the external alternating magnetic field causes the magnetization vector of inducible polarizer 550 to rotate in the plane. In some embodiments, the external alternating magnetic field also interacts with the magnetization vector of free layer 536, thereby assisting the precession of the magnetization vector of the free layer 536. An electrical current pulse (i.e., a programming current pulse) can then be applied to MTJ stack 560 comprising inducible polarizer 550 and MTJ 530. Application of the programming current to MTJ stack 560 generates a spin current that exerts a spin transfer torque on the magnetization vector of free layer 536. The spin transfer torque comprises an in-plane spin transfer torque that exerts torque on the free layer is determined in part by the direction of the magnetization vector of the inducible polarizer 550. In some embodiments, the alternating frequency of the external alternating magnetic field is set to a frequency value such that the external alternating magnetic field causes the magnetization vector of inducible polarizer 550 to precess at a frequency that is synchronized with the predetermined precession frequency of the magnetization vector of free layer 536. In such embodiments, the in-plane spin transfer torque will assist switching of the free layer in a manner similar to the switching enhancement offered by PSC layer 350, described above.

However, in contrast to magnetic device 300, the inducible polarizer 550 is not magnetically or electronically coupled to free layer 536; rather, the precession of the inducible polarizer 550 is controlled by the external alternating magnetic field. Therefore, the magnetization vector of inducible polarizer 550 can rotate in such a manner as to apply an in-plane spin transfer torque that enhances the precession of free layer 536 even when the in-plane spin transfer torque is generated by the reflected spin current from inducible polarizer 550 (i.e., when switching free layer 536 from the antiparallel direction to the parallel direction).

Moreover, unlike magnetic device 300, where precession of the magnetization vector of PSC layer 350 is caused by application of an electrical current to MTJ stack 300, application of an electrical current to MTJ stack 560 in magnetic device 500 does not cause precession of the magnetization vector of inducible polarizer 550. Precession of the magnetization vector of inducible polarizer 550 occurs when the external alternating magnetic field is interacting with inducible polarizer 550. Thus, precession of the magnetization vector of inducible polarizer 550 is effectively decoupled from the programming current applied to MTJ stack 560. In some embodiments, the magnetization vector of free layer 532 will not switch unless the magnetization vector of inducible polarizer 550 is precessing. In such embodiments, an electrical current can be applied to MTJ stack 560 and the magnetization vector of inducible polarizer 560 will not precess unless the external alternating magnetic field has been generated. Therefore, the resistance across MTJ stack 560 can be measured (i.e., the bit can be read) in the absence of the external alternating magnetic field and there will be an extremely low probability of inadvertently switching the free layer 536 (i.e., read disturb) when reading the bit in this manner. Thus, the various embodiments disclosed herein, such as magnetic device 500, offer several advantages to the magnetic devices described in the prior art.

Figure 6A:
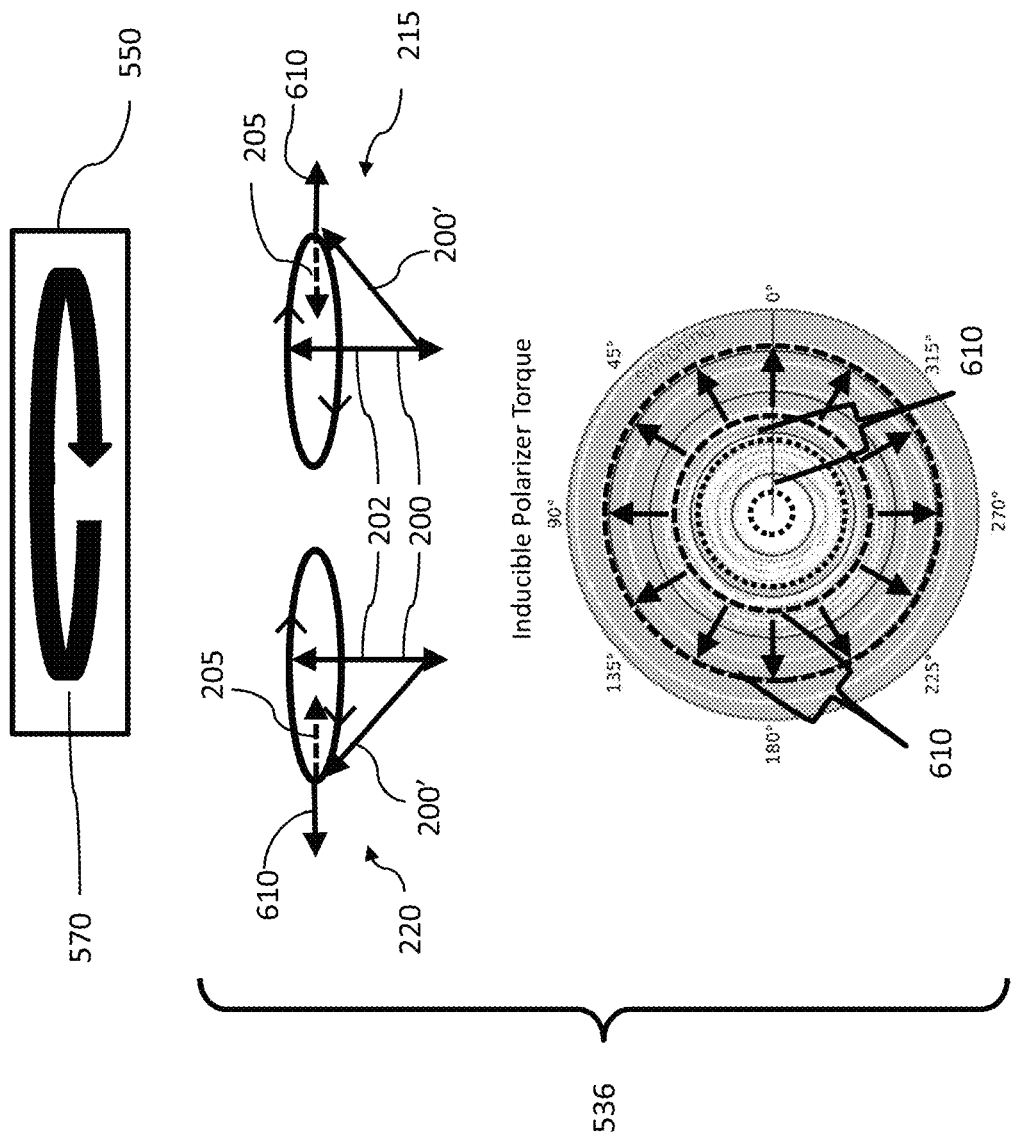
FIGS. 6a-6b illustrates the precession of the free layer in an MTJ with an in-plane polarizing magnetic layer with a magnetization vector that precesses upon exposure to an external alternating magnetic field (i.e., an inducible precessional magnetic layer)
Figure 6B:
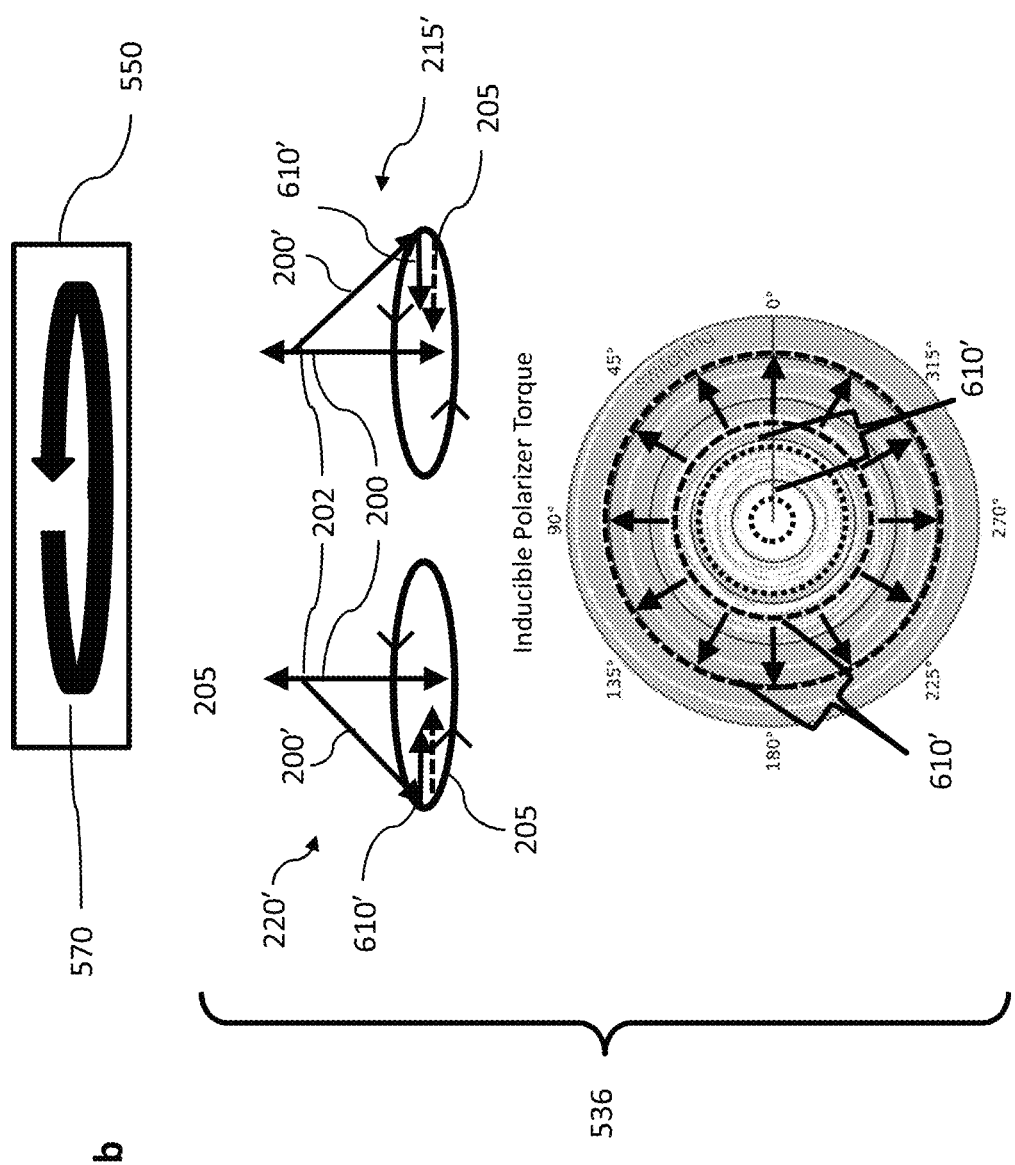

FIGS. 6a and 6b show the concepts behind the writing process of the various devices disclosed herein. The magnetization dynamics depicted in FIGS. 6a and 6b are approximations of the dynamics that occur during the initial stages of switching the magnetization vector of free layer 536 (i.e., when the polar angle between axis 200 and magnetic vector 200' is small). At larger magnetization polar angles (i.e., greater than 10 degrees from equilibrium), the dynamics presented in these figures are no longer valid approximations of the magnetization dynamics of the free layer. Nevertheless, the precessional dynamics that occur at small magnetization polar angles are to a great extent determinative of the switching process and are therefore useful in understanding the disclosures herein. Moreover, because the precessional dynamics at small magnetization polar angles are important to improved switching of the free layer, the frequency at which the inducible precessional magnetic layer rotates/precesses (i.e., the induced rotation frequency) is matched to the precession frequency of the free layer at small magnetization polar angles (i.e., the predetermined precession frequency).

Like the PSC layer 550 previously discussed, the inducible precessional magnetic layer 550 has a magnetic vector 570 with an in-plane component that can freely rotate (top of FIG. 6a). However, the magnetization vector 570 of inducible polarizer 550 rotates upon exposure to an external alternating magnetic field, not upon application of an electrical current to MTJ stack 560. This is in contrast to the magnetization vector 270 of the PSC layer 350, which rotates when an electrical current is applied to MTJ stack 300. Free layer 536 is similar to the free layer 136 previously discussed, in that it has an inherent damping characteristic 205 that can be overcome with the assistance of spin transfer torque. As seen in the middle of FIG. 6a, the in-plane spin transfer torque 610 causes the magnetization direction 200' of the free layer 536 to precess in a cone-like manner around an axis 202 perpendicular to the plane of the layers. FIG. 6a shows a progression of rotation of the magnetic direction 200' about axis 202. As discussed, when a spin polarized current traverses the device, the magnetization of the free layer 536 precesses in a continuous manner (i.e., it turns on itself in a continuous manner as shown in the middle of FIG. 6a) with maintained oscillations until the magnetic direction of free layer 536 is opposite the magnetic direction prior to the spin torque causing precession, i.e., the magnetic direction of free layer 536 switches by 180 degrees.

The spin-polarized electrons of the spin-polarized current exert a spin transfer torque on the magnetization vector 200 of the free layer 536. This spin transfer torque has both an in-plane spin torque component 610 and a perpendicular spin torque component (not shown in FIG. 6a). The perpendicular spin torque exerts a force on the magnetization vector of the free layer 536 that pulls the magnetization vector from one perpendicular position to the other perpendicular position (i.e., from the parallel to the anti-parallel state). This perpendicular spin torque component is caused by the spin-polarization of the electrons by the reference magnetic layer 532 (depicted in FIG. 7). The in-plane spin torque 610 assists in the switching of the free layer by providing a force that pushes the magnetization vector 200' away from the perpendicular axis 202, allowing the perpendicular spin transfer torque to act on the magnetization vector 200', thereby switching the free layer 536. This in-plane spin torque 610 is caused by spin-polarization of the electrons by the inducible precessional magnetic layer 550.

As discussed above, the magnetization vector 570 of inducible precessional magnetic layer 550 precesses at an induced rotation frequency due to the application of an external alternating magnetic field to the inducible precessional magnetic layer 550. The induced rotation frequency is dependent on, inter alia, the dimensions and composition of inducible precessional magnetic layer 550 and the frequency at which the external alternating magnetic field oscillates between the first magnetic field direction and the second magnetic field direction. This magnetic field oscillating frequency is, in turn, dependent on the dimensions and composition of external wire 580 and the frequency of the alternating current that is directed through the external wire 580. Therefore, the induced rotation frequency can be set to match the predetermined precession frequency of the magnetization vector of the free magnetic layer 536.

When the induced rotation frequency of the inducible precessional magnetic layer 550 is matched to the predetermined precession frequency of the free magnetic layer 536, the in-plane spin transfer torque 610 generated by the inducible polarizer 550 enhances the precession of the free magnetic layer 536 throughout the entire 360 degree precession, as shown on the bottom of FIG. 6a. During switching of free layer 536 from the parallel direction to the antiparallel direction, the magnetization vector 570 of the inducible polarizer 550 precesses in the same direction as the precession of the magnetization vector 200' of free layer 536 (as depicted on the top of FIG. 6a). When magnetization vector 270 precesses in the same direction as magnetization vector 200' and the two precession frequencies are matched, the inducible polarizer 550 can be set to rotate such that magnetization vector 270 effectively follows the precession of magnetization vector 200' in a manner similar to that observed in magnetic device 300 utilizing PSC magnetic layer 350. In other words, the direction of the in-plane component of the magnetization vector 570 is parallel to the direction of the in-plane component of the magnetization vector 200' throughout the precession of magnetization vector 200'. In such embodiments, during switching the free layer 536 from the parallel direction to the antiparallel direction, the transverse spin current (generated by the application of the programming current across MTJ stack 560) exerts an in-plane spin transfer torque that pushes magnetization vector towards the equator throughout the precession of the free layer. In this way, the inducible polarizer 550 enhances the efficiency of switching the free layer 536 during switching from the parallel direction to the antiparallel direction (i.e., from the first magnetization direction to the second magnetization direction).

Figure 4A:
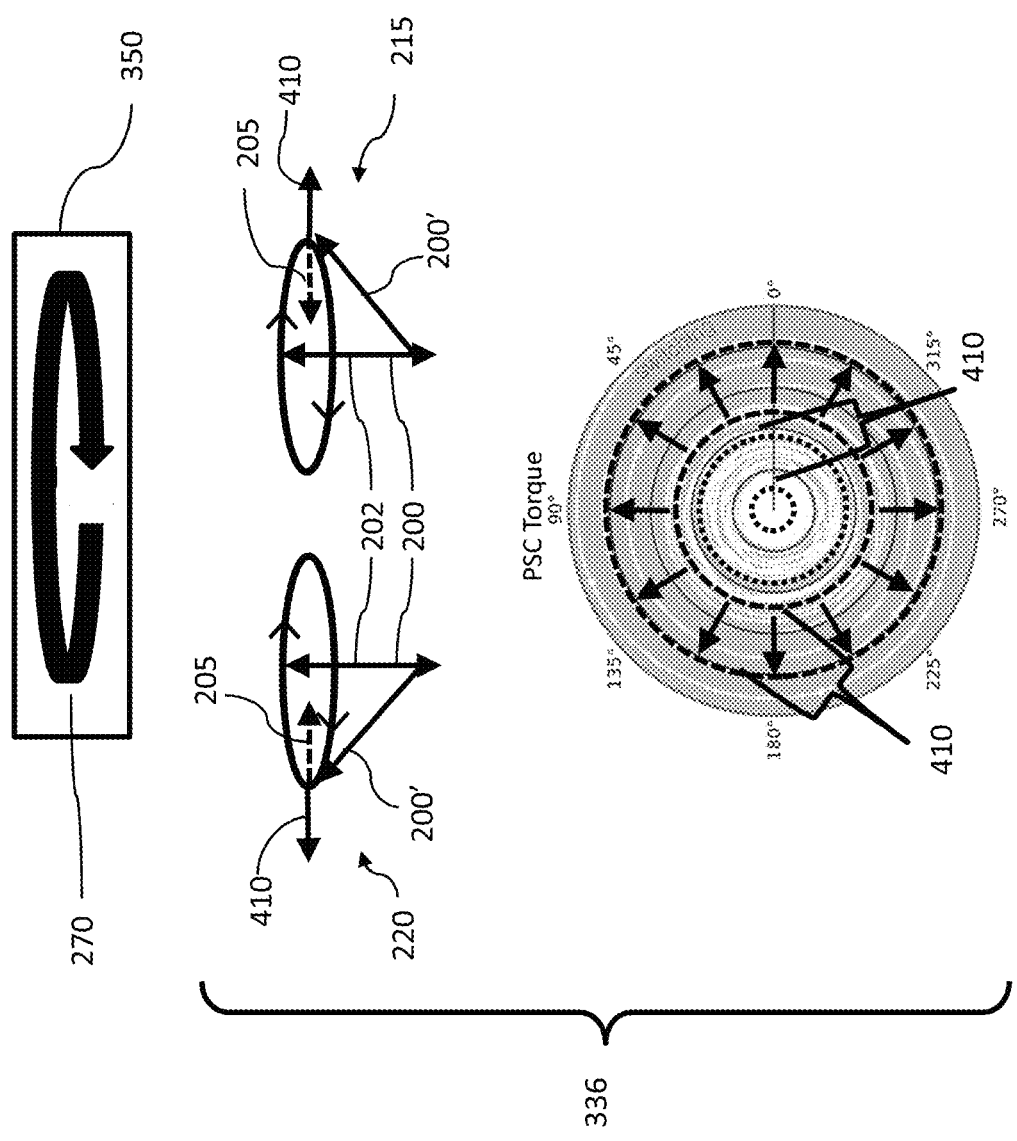
FIGS. 4a-4b illustrates the precession of the free layer in an MTJ with a precessional spin current magnetic layer having a magnetization direction that rotates freely.
Figure 4B:
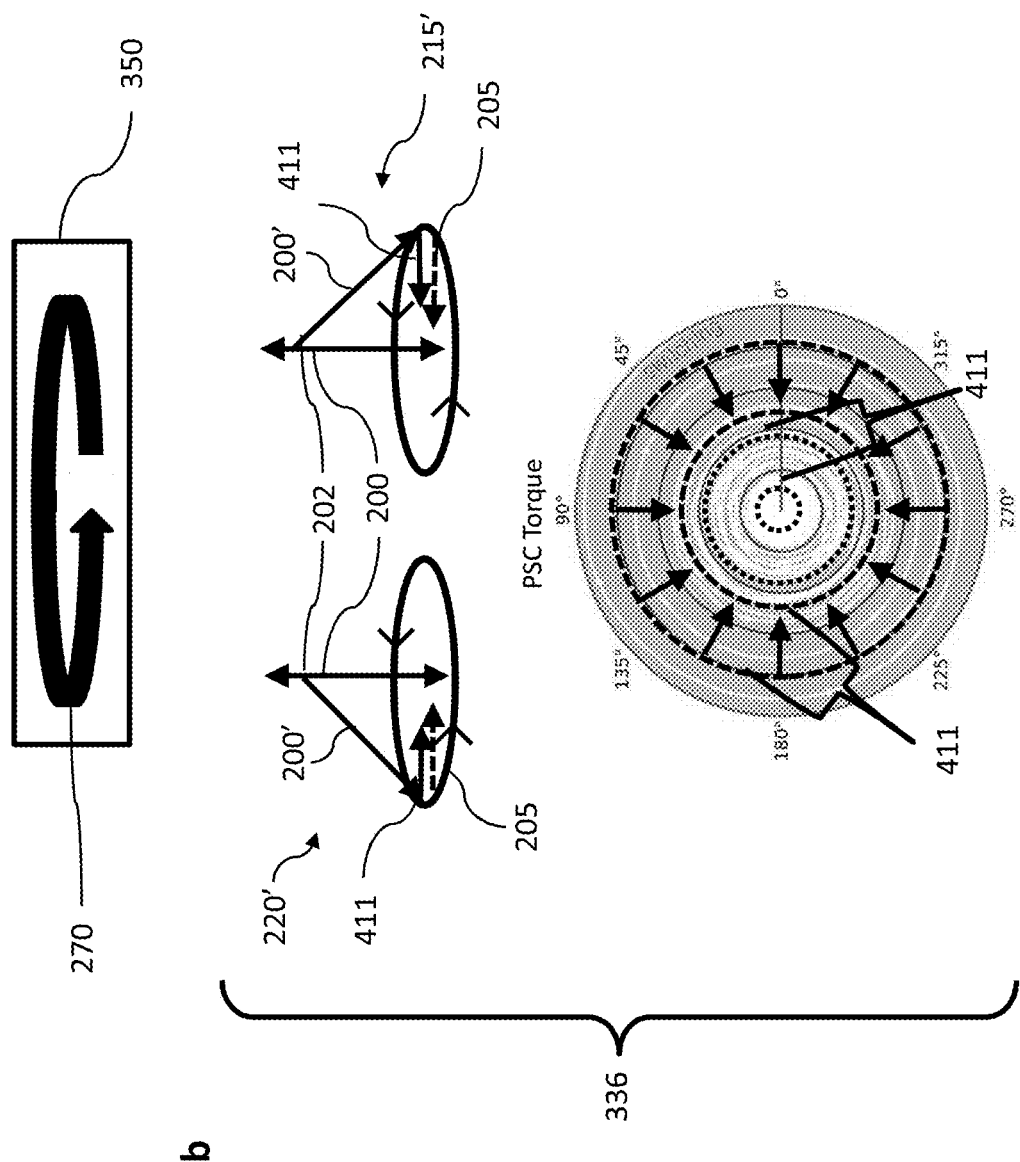

The magnetization dynamics during switching the free layer 536 from the antiparallel direction to the parallel direction, shown in FIG. 6b, are similar to, but distinctly different from, the magnetization dynamics depicted in FIG. 6a (i.e., those observed during switching of the free layer from the parallel direction to the antiparallel direction). As discussed above, the precessional dynamics of magnetization vector 570 are decoupled from the free layer 536 and are controlled by the external alternating magnetic field. Consequentially, the magnetization vector 570 of inducible polarizer 550 does not necessarily follow the precession of free layer 536. In some embodiments, the direction of the in-plane component of magnetization vector 570 is antiparallel to the direction of the in-plane component of magnetization vector 200' during switching free layer 536 from the second magnetization direction to the first magnetization direction (i.e., from the antiparallel direction to the parallel direction). As described above, during switching the free layer from the antiparallel direction, the in-plane spin transfer torque is generated by the reflected spin current from inducible polarizer 550. Also as described above, the direction of the in-plane spin transfer torque generated by this reflected spin current is antiparallel to the direction of magnetization vector 570. Thus, when the in-plane component of the magnetization vector 570 is antiparallel to the in-plane component of the magnetization vector 200', the in-plane spin transfer torque generated by the reflected spin current from inducible polarizer 550 is in the same direction as the in-plane component of magnetization vector 200'. In this way, the spin transfer torque generated by inducible polarizer 550 can enhance the precession of free layer 536, even when switching the free layer 536 from the antiparallel direction to the parallel direction. Moreover, when the induced rotation frequency of the inducible polarizer 550 is matched to the predetermined precession frequency of the free magnetic layer 536, the two magnetization vectors (i.e., magnetization vector 570 and magnetization vector 200') can maintain antiparallel orientation throughout their respective precessions. Thus, the inducible polarizer 550 can enhance the efficiency of switching the free layer during switching from the antiparallel direction to the parallel direction (i.e., from the second magnetization direction to the first magnetization direction). In some embodiments, the rotational direction of the inducible polarizer 550 is opposite from the precessional direction of the free magnetic layer 536, thereby avoiding potential enhancement of the damping characteristic 205 when switching from the antiparallel state to the parallel state (i.e., the precessional dynamic depicted in FIG. 4b).

Figure 3:
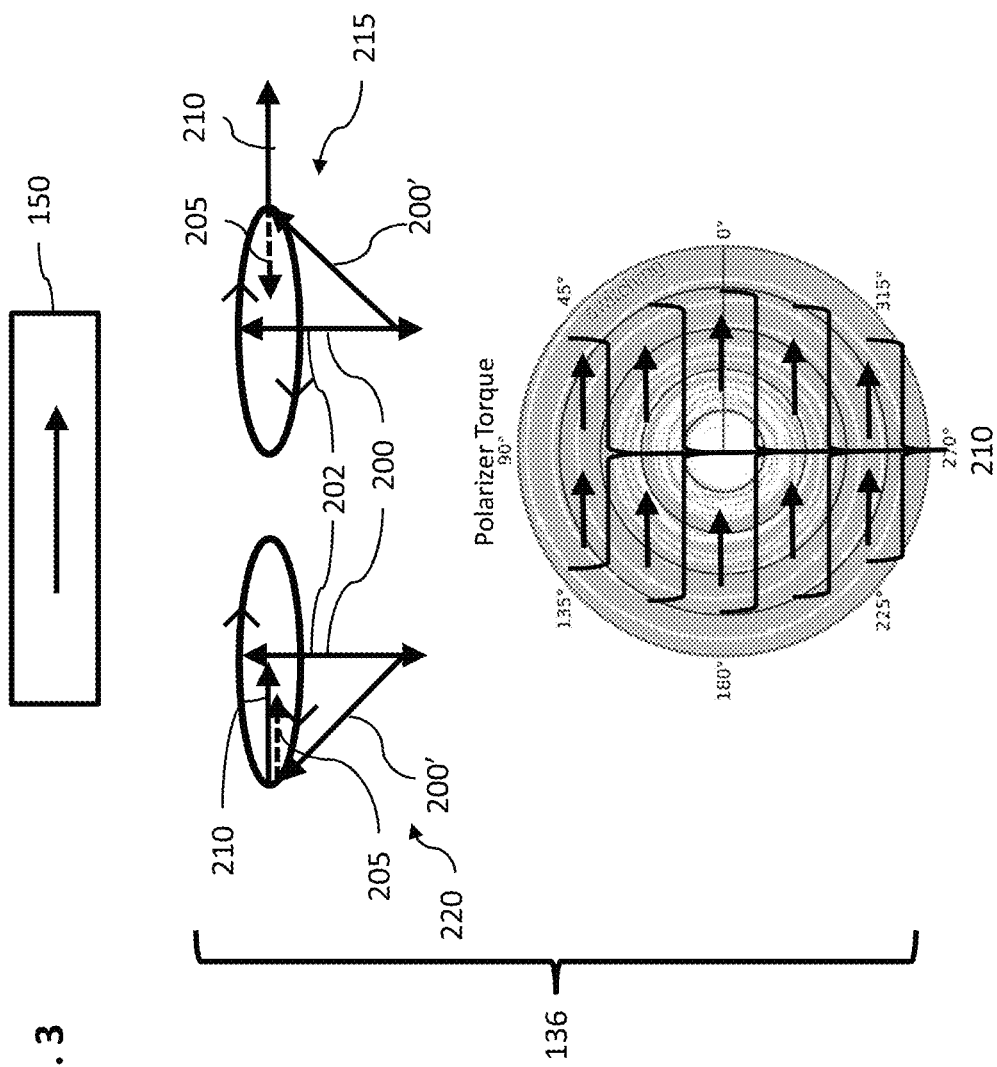
FIG. 3 illustrates the precession of the free layer in an MTJ used with a polarizing magnetic layer having a fixed magnetization direction.

Magnetic devices that utilize inducible polarizers, such as magnetic device 500, also possess the advantage of greatly reduced read disturb probabilities (i.e., the probability that the free layer will be switched when reading the bit). In the absence of the external alternating magnetic field, the magnetic vector of the inducible polarizer 550 does not rotate; rather the magnetization vector of the inducible polarizer 550 is fixed and its magnetization dynamics are similar to those depicted in FIG. 3 and described above. As a result, the in-plane spin transfer torque provides no net benefit for switching the free layer and writing the bit requires a significantly stronger programming current. Thus, the bit can be read in the absence of the external alternating magnetic field (i.e., with no alternating current running through external wire 580), with a significantly reduced read disturb probability.

Figure 7:
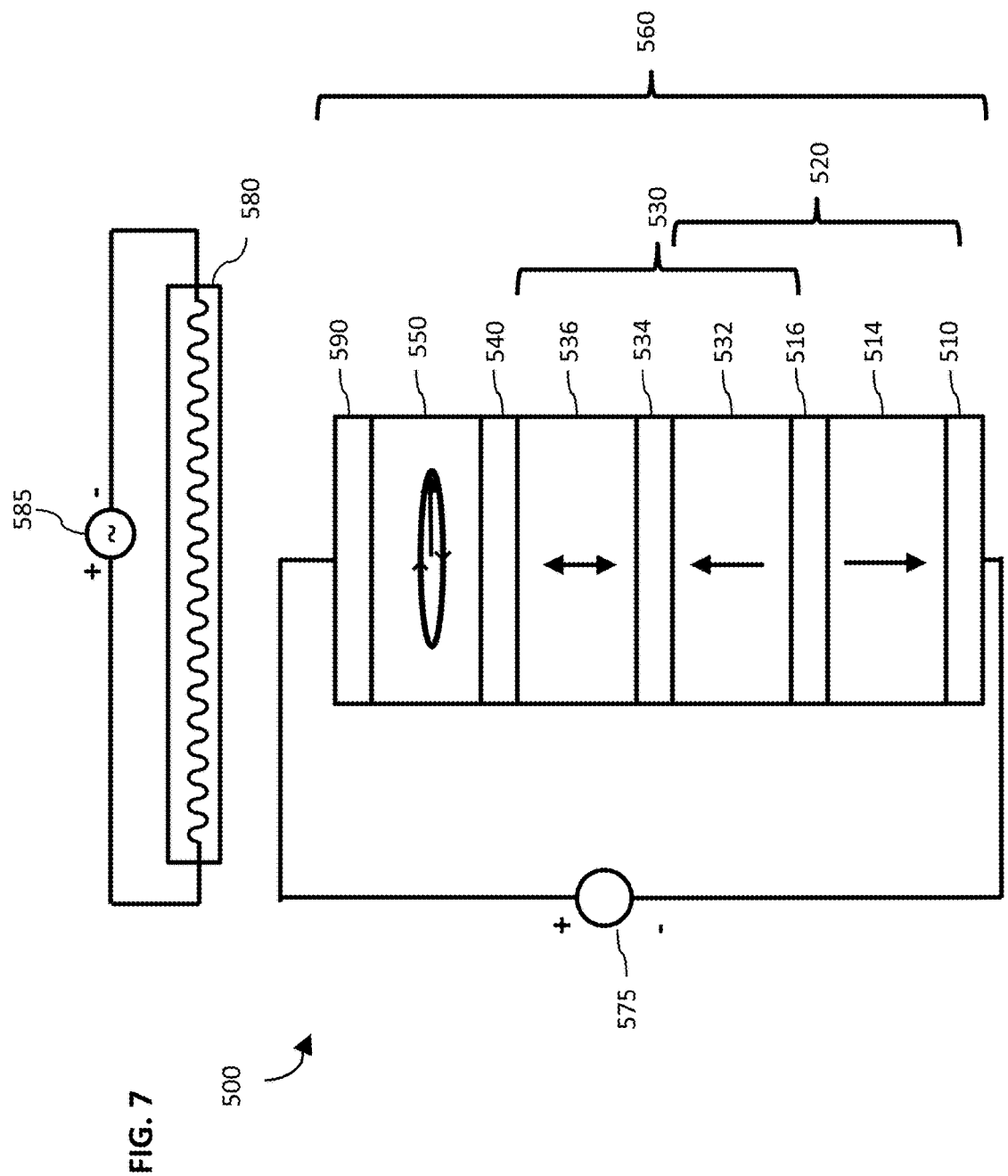
FIG. 7 illustrates an MTJ stack for an MRAM device utilizing an inducible precessional magnetic layer and an external wire that generates an external alternating magnetic field.

A memory cell with an inducible precessional magnetic layer 550, an external wire 580 and an MTJ structure 530 is shown in FIG. 7. MTJ structure 300 includes one or more seed layers 510 provided at the bottom of stack 560 to initiate a desired crystalline growth in the above-deposited layers. Synthetic antiferromagnetic (SAF) layer 520 is disposed over seed layer 510. SAF layer 520 is comprised of a first SAF layer 532, anti-ferromagnetic coupling layer 516 and second SAF layer 514. Second SAF layer 514 is deposited over seed layer 510, while anti-ferromagnetic coupling layer 516 is placed over second SAF layer 514. MTJ 530 is deposited over anti-ferromagnetic coupling layer 516. MTJ 530 includes first SAF layer 532, which acts as the reference layer of the MTJ, and is also part of SAF layer 520. A tunneling barrier layer (i.e., the insulator) 534 is over first SAF layer 532 while the free layer 536 is disposed over tunneling barrier layer 534. As shown in FIG. 7, the magnetization vector of first SAF layer 532 has a magnetization direction that is preferably perpendicular to its plane, although variations of a several degrees are within the scope of what is considered perpendicular. As also seen in FIG. 7, free layer 536 also has a magnetization vector that is preferably perpendicular to its plane, but its direction can vary by 180 degrees. A nonmagnetic spacer 540 is disposed over of MTJ 530. Inducible precessional magnetic layer 550 is disposed over nonmagnetic spacer 540. In one embodiment, inducible precessional magnetic layer 550 has a magnetization vector having a magnetic vector with a component parallel to its plane, and perpendicular to the magnetic vector of the reference layer 532 and free layer 536. In one embodiment inducible precessional magnetic layer 550 has a magnetization vector having a magnetic vector that is parallel to its plane, and is perpendicular to the magnetic vector of the reference layer 532 and free layer 536. In such embodiments, the magnetization vector of inducible precessional layer 550 has a magnetization direction that is preferably parallel to its plane, although variations of a several degrees are within the scope of what is considered parallel. In one embodiment, inducible precessional magnetic layer 550 has a magnetization vector that is able to precess around an axis perpendicular to its plane upon application of an external alternating magnetic field. In one embodiment, inducible precessional magnetic layer 550 has a magnetization vector having a vector component that rotates in its plane. One or more capping layers 590 can be provided on top of inducible precessional magnetic layer 550 to protect the layers below on MTJ stack 560.

Seed layer 510 in the MTJ structure shown in FIG. 7 preferably comprises Ta, TaN, Cr, Cu, CuN, Ni, Fe or alloys thereof. Second SAF layer 514 preferably comprises either a Co/Ni, Co/Pt or Co/Pd multilayer structure. First SAF layer 532 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 516 is preferably made from Ru having thickness in the range of three to ten Angstroms. Tunneling barrier layer 534 is preferably made of an insulating material such as MgO, with a thickness of approximately ten Angstroms. Free layer 536 is preferably made with CoFeB deposited on top of tunneling barrier layer 534. Free layer 536 can also have layers of Fe, Co, Ni or alloys thereof and W and Ta insertion layers to promote perpendicular anisotropy. Spacer layer 540 over MTJ 530 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer, or 2-20 Angstroms $Al_2O_3$ layer.

Nonmagnetic spacer 540 has a number of properties. For example, nonmagnetic spacer 540 physically separates the free layer 536 and the in-plane polarization magnetic layer 550. Nonmagnetic spacer 540 transmits spin current efficiently from the in-plane polarization magnetic layer 550 into the free layer 536 because it preferably has a long spin diffusion length if made metallic. Nonmagnetic spacer 540 also promotes good microstructure and high tunneling magnetoresistance (TMR) and helps keep the damping constant of the free layer 536 low. In one embodiment, nonmagnetic space 540 comprises MgO. In one embodiment, nonmagnetic spacer 540 is of a thickness sufficient to prevent electronic and/or magnetic coupling of free magnetic layer 536 with inducible precessional magnetic layer 550.

The inducible precessional magnetic layer 550 is preferably made from CoFeB. It can also be made with Co, Fe, Ni magnetic layers or can be made out of their alloys. The magnetic alloys can also have boron, tantalum, copper or other materials. In some embodiments, the inducible precessional magnetic layer preferably has a weak or nonexistent in-plane uniaxial anisotropy and preferably a low magnetic moment. This allows the magnetic vector of the inducible polarizer to be driven by the alternating magnetic field, thereby remaining at the inducible precession frequency set, in part, by the oscillating frequency of the magnetic field. If the in-plane anisotropy or magnetic moment is too strong, the magnetization vector of the inducible polarizer would not properly follow the applied alternating magnetic field when being driven at a high frequency. Finally capping layer 590 can be any material that provides good interface to the in-plane layer such as Ta, TaN, Ru, MgO, Cu, etc.

External wire 580 has a number of properties. External wire 580 is preferably a good conductor of electrical current. In some embodiments, external wire 580 is a metal or a metallic material. External wire 580 preferably generates an alternating magnetic field upon application of an alternating electrical current to the external wire 580. In some embodiments, external wire 580 is not directly connected to MTJ stack 560. In some embodiments, external wire 580 is preferably proximate to MTJ stack 560 such that the alternating magnetic field, generated by the passage of an alternating current through external wire 580, can interact with the magnetization vector of the inducible precessional magnetic layer 550. In some embodiments, external wire 580 is preferably proximate to MTJ stack 560 such that the alternating magnetic field, generated by the passage of an alternating current through external wire 580, can interact with the magnetization vector of the free magnetic layer 536. In one embodiment, the distance between the external wire 580 and the MTJ stack 560 is less than 200 nanometers. In one embodiment, the distance between the external wire 580 and the MTJ stack 560 is less than 50 nanometers. In one embodiment, the distance between the external wire 580 and the MTJ stack 560 is less than 10 nanometers.

In some embodiments, first current source 585 generates an alternating current. In some embodiments, first current source 585 generates electrical current comprising an alternating current. In some embodiments, first current source 585 generates an electrical current that comprises an alternating current and a direct current. In some embodiments, first current source 585 directs an electrical current comprising an alternating current through the external wire 580 thereby generating an external alternating magnetic field. In addition, first current source 585 can be configured to produce an alternating current having an oscillation frequency that generates an external alternating magnetic field that is matched to the predetermined precession frequency of the free magnetic layer 536. In addition, first current source 585 can be configured to produce an alternating current having an oscillation frequency, which is matched to the predetermined precession frequency of the free magnetic layer 536. In some embodiments, second current source 575 can generate a programming current pulse that comprises a direct current. In some embodiments, second current source 575 can generate a direct current. Second current source 575 can also generate programming currents with various ratios of alternating current and direct current. In some embodiments, second current source 575 can generate a programming current comprising a direct current and the current strength of the direct current can be changed from a first direct current value to a second direct current value.

The manner in which a bit is written using magnetic device 500 comprising MTJ 530, inducible precessional magnetic layer 550 and external wire 580 will now be described. In particular, a first electrical current is supplied, for example, by first current source 585, which passes electrical current through external wire 580. Passage of the first electrical current through external wire 580 generates an external magnetic field proximate to the external wire 580. In one embodiment, the first electrical current comprises an alternating current. Application of this alternating current to external wire 580 generates an external alternating magnetic field proximate to external wire 580. The magnetization direction of the external magnetic field oscillates between a first direction and a second direction at an oscillation frequency, which is at least in part determined by the alternating current frequency and the structure of external wire 830. In some embodiments, the external alternating magnetic field exerts a force on the magnetization vector of inducible precessional magnetic layer (i.e., inducible polarizer) 550. The external alternating magnetic field causes the magnetization vector of inducible polarizer 550 to precess at an specified precession frequency (i.e., the induced rotation frequency) around an axis perpendicular to the plane of the inducible polarizer 550. The induced rotation frequency is at least in part determined by oscillating frequency of the external alternating magnetic field and the structure (i.e., dimensions and composition) of the inducible polarizer 550. The magnetization vector of the inducible polarizer 550 continues to precess at this induced rotation frequency as long as the external alternating magnetic field is being applied to the inducible polarizer 550.

A second electrical current is supplied, for example, by second current source 575, which passes electrical current through the inducible polarizer 550, the non-magnetic spacer 540, the free magnetic layer 536, the non-magnetic tunneling barrier layer 534, and the reference layer 532. Application of the second electrical current (i.e., programming current) to the MTJ stack 560 creates a spin polarized current that passes through non-magnetic spacer layer 540, free magnetic layer 536, tunneling barrier layer 534, and reference magnetic layer 532. The spin polarized current exerts a spin transfer torque on free magnetic layer 536, which helps overcome the inherent damping of the magnetic material making up the free layer 536. The spin transfer torque is composed of an in-plane spin transfer torque and a perpendicular spin transfer torque. In one embodiment, when switching the free layer 536 in one direction (i.e., from the parallel direction to the anti-parallel direction), the in-plane spin transfer torque is caused by the transverse spin current generated by the inducible polarizer 550 and the perpendicular spin transfer torque is caused by the reflected spin current generated by the reference magnetic layer 532. As discussed above, the transverse spin current from inducible polarizer 550 exerts an in-plane spin transfer torque 610 on the magnetization vector that is aligned with the magnetization vector 570 of the inducible polarizer 550. Because the external alternating magnetic field causes rotation of the in-plane component of magnetization vector 570 at the induced rotation frequency, the direction of in-plane spin transfer torque 610 rotates at the same induced rotation frequency.

The spin current causes the magnetization vector the free magnetic layer 536 to precess about its axis, which is shown in FIG. 6a. In some embodiments, the external alternating magnetic field interacts directly with the magnetization vector of free layer 536, thereby initiating or enhancing the precession of the free layer 536. As also discussed above, the precession of the magnetic vector of free magnetic layer 536 occurs at a predetermined precession frequency when the magnetization angle is relatively low (i.e., the magnetization vector 200' is within roughly 10 degrees of perpendicular axis 202). In some embodiments, the induced rotation frequency is synchronized with the predetermined precession frequency. The precession of magnetization vector 570 of inducible polarizer 550 will match the precession of magnetization vector 200' while magnetization vector 200' precesses at the predetermined precession frequency (i.e., when the magnetization angle of magnetization vector 200' is low). In some embodiments, the direction of the in-plane component of magnetization vector 570 will be aligned with (i.e., parallel to) the in-plane component of magnetization vector 200' throughout its precession. Therefore, as depicted in FIG. 6a, the transverse spin current will exert a spin transfer torque 610 on magnetization vector 200' that pushes magnetization vector 200' away from perpendicular axis 202 throughout the entire precession. In this way, the inducible polarizer 550 enhances the efficiency of switching the free layer 536 in the presence of the external alternating magnetic field and the programming current.

A similar process is utilized when writing the bit from the antiparallel state to the parallel state. In one embodiment, the magnetization vector 570 rotates at the predetermined rotation frequency in the same direction as the precessions of magnetization vector 200'; however the in-plane direction the in-plane component of magnetization vector 570 is antiparallel to the in-plane magnetization vector of 200'. As discussed above, the spin transfer torque 610' (generated by the reflected spin current from inducible polarizer 550) is aligned with the in-plane magnetization vector of 200' when the in-plane components of magnetization vectors 570 and 200' are antiparallel to each other. Therefore, in embodiments where the induced rotation frequency is matched to the predetermined precession frequency, magnetization vectors 570 and 200' can maintain this antiparallel orientation throughout the precession of magnetization vector 200'. Such antiparallel synchronization is possible because free layer 536 and inducible polarizer 550 are not electronically or magnetically coupled; rather, the rotation of magnetization vector 570 is controlled by the external alternating magnetic field. As a result of this synchronization, as depicted in FIG. 6b, the reflected spin current can exert a spin transfer torque 610' on magnetization vector 200' that pushes magnetization vector 200' away from perpendicular axis 202 throughout the entire precession. In this way, the inducible polarizer 550 enhances the efficiency of switching the free layer 536 in the presence of the external alternating magnetic field and the programming current, even when switching from the antiparallel state to the parallel state. In other embodiments, the magnetic direction of the magnetic vector of inducible polarizer 550 rotates in the opposite direction as the magnetic vector of free layer 536, thereby avoiding potential enhancement of the damping characteristic 205 when switching from the antiparallel state to the parallel state (i.e., the precessional dynamic depicted in FIG. 4b).

The rotational direction of the inducible polarization magnetic layer 550 is preferably set externally, such that the rotation direction of the inducible polarizer 550 is decoupled from the precession direction of free layer 536. In some embodiments, the rotational direction of the inducible polarizer 550 is set by an external uniform magnetic field. In one embodiment, the rotational direction of the inducible polarizer 550 is set by the fringing fields from the magnetization vector of the reference magnetic layer 532.

Magnetic devices that utilize inducible polarizers, such as magnetic device 500, offer additional advantages during the reading process. In particular, these devices offer all of the advantages, described above, for improved switching during the writing process, but also allow a significantly reduced read disturb probability. Synchronization of the inducible polarizer 550 with the precession of free layer 536 allows for a reduced threshold switching current (i.e., lower current values are required to switch the magnetization direction of free layer 536. Advantages afforded by this lower switching threshold include reduction in write error rate, reduced damage to the device during each writing process, and an increase in device stability over time. However, lower switching threshold currents can increase the probability of inadvertently writing the bit during the read process. Typically, a weaker current is used during the read process, allowing the resistance across the MTJ to be measured without generating a spin-current that is strong enough to switch the magnetic vector of the free layer. However, when an inducible polarizer is used as described above, the strength of the current required to switch the free layer is greatly reduced. Therefore, unless these systems can be bypassed, there will be a substantial probability of inadvertently switching the free layer during the reading process (i.e., read disturb), even if a weaker read current is used.

In devices such as magnetic device 500, the rotation of the magnetization vector 570 of the inducible polarizer is controlled by the external alternating magnetic field. In the absence of the external alternating magnetic field, the magnetic vector of the inducible polarizer 550 does not rotate, and as a result, switching the bit requires a significantly stronger programming current. Thus, the bit can be read in the absence of the external alternating magnetic field (i.e., with no alternating current running through external wire 580), thereby allowing the resistance across MTJ structure 560 to be read with a very low read disturb probability. In some embodiments, the magnetization vector of the free layer 536 will not switch in the absence of the external alternating magnetic field, thereby allowing the bit to be read with essentially zero probability of read disturb.

Figure 8:
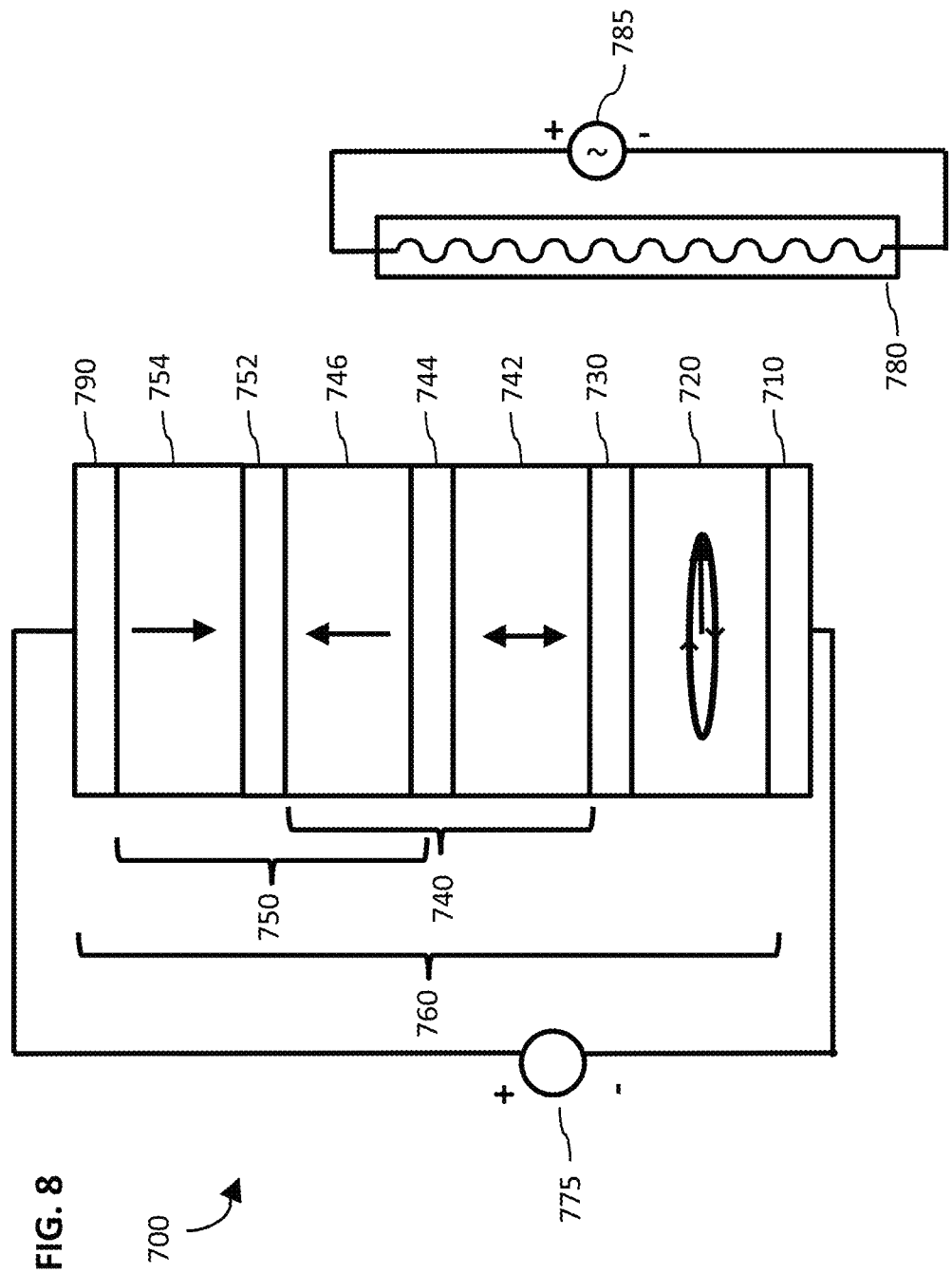
FIG. 8 illustrates an alternative embodiment of an MTJ stack for an MRAM device utilizing an inducible precessional magnetic layer and an external wire that generates an external alternating magnetic field.

An alternative embodiment is shown in FIG. 8. In this embodiment, magnetic device 700 has had its MTJ stack inverted with respect to the embodiment shown in FIG. 7, and the location of external wire 780 has been changed relative to the embodiment shown in FIG. 7. In particular, magnetic device 700 includes a seed layer 710. Inducible precessional magnetic layer 720 is placed over seed layer 710. Inducible precessional magnetic layer 720 has the same properties, construction and characteristics as inducible precessional magnetic layer 550, discussed above. Nonmagnetic spacer 730 is placed over inducible precessional magnetic layer 720. Nonmagnetic spacer 730 has the same properties, construction and characteristics as nonmagnetic spacer 540, discussed above. MTJ 740 is placed over nonmagnetic spacer 730. MTJ 740 is generally constructed of free layer 742 (which is placed over nonmagnetic spacer 730) and reference layer 746. Free layer 742 and reference layer 746 are spatially separated from each other by tunneling barrier layer 744, which is made of an insulating material. Tunneling barrier layer 744 also forms part of synthetic antiferromagnetic (SAF) layer 750. SAF layer 750 is comprised of a first SAF layer 746, which is also the reference layer of device 700, anti-ferromagnetic coupling layer 752 and second SAF layer 754. Anti-ferromagnetic coupling layer 752 is placed over first SAF layer 746. Second SAF layer 754 is placed over antiferromagnetic coupling layer 752. Finally, capping layer 790 is placed over SAF layer 750. External wire 780 is physically separate from MTJ stack 760. External wire 780 is located proximate to free magnetic layer 742 and inducible precessional magnetic layer 720, such that the external alternating magnetic field generated by external wire 780 can interact with free magnetic layer 742 and inducible precessional magnetic layer 720. External wire 780 has the same properties, construction and characteristics as external wire 580, discussed above. A first current comprising an alternating current can be provided by first current source 785. A second current (i.e., a programming current) can be provided by second current source 775. Other than the ordering of the layers and the relative positioning of the MTJ stack and the external wire, magnetic device 700 operates in the same manner as described with respect to the embodiment shown in FIG. 7. Thus, just as shown in FIGS. 6a-6b, inducible precessional magnetic layer 720 can rotate in such a way that spin transfer torque 610 is applied in a beneficial manner throughout the entire precession cycle of free layer 742. In addition, the rotation of inducible precessional magnetic layer 720 is controlled by the external alternating magnetic field generated by external wire 780, such that rotation of inducible precessional magnetic layer 720 only occurs when the magnetization vector of free layer 742 is being switched (i.e., the bit is being written).

All of the layers of devices 500 and 700, illustrated in FIGS. 7 and 8, can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., oxygen, argon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stacks 500 and 700 are well-known to those skilled in the art and will not be described in detail herein so as not to unnecessarily obscure aspects of the disclosure herein.

It should be appreciated to one skilled in the art that a plurality of MTJ structures 500 and 700 can be manufactured and provided as respective bit cells of an STT-MRAM device. In other words, each MTJ stack can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device comprising:
    a reference magnetic layer in a first plane, the reference magnetic layer having a magnetization vector that is perpendicular to the first plane and having a fixed magnetization direction;
    a non-magnetic tunnel barrier layer in a second plane and disposed over the reference magnetic layer;
    a free magnetic layer in a third plane and disposed over the non-magnetic tunnel barrier layer, the free magnetic layer having a magnetization vector that is perpendicular to the third plane and having a magnetization direction that can switch from a first magnetization direction to a second magnetization direction and from the second magnetization direction to the first magnetization direction, with a switching process that involves precessions around an axis perpendicular to the third plane, the magnetization vector of the free magnetic layer having a predetermined precession frequency, the reference magnetic layer, the non-magnetic tunnel barrier layer, and the free magnetic layer forming a magnetic tunnel junction (MTJ);
    a non-magnetic spacer in a fourth plane and disposed over the free magnetic layer;
    an inducible precessional magnetic layer in a fifth plane and disposed over the non-magnetic spacer, the inducible precessional magnetic layer having a magnetization vector with a magnetization component in the fifth plane that rotates at an induced rotation frequency in the presence of an external alternating magnetic field and is fixed in the absence of the external alternating magnetic field;

an external wire that is physically separate from the MTJ, the non-magnetic spacer and the inducible precessional magnetic layer, the external wire generating the external alternating magnetic field upon direction of an alternating current through the external wire; wherein the external wire is proximate to the inducible precessional magnetic layer, thereby enabling the external alternating magnetic field to induce rotation of the magnetization vector of the inducible precessional magnetic layer;

a first current source that is physically separate from the MTJ, the non-magnetic spacer and the inducible precessional magnetic layer, the first current source directing an alternating current through the external wire, thereby generating the external alternating magnetic field; and a second current source that directs a programming current through the inducible precessional magnetic layer, the non-magnetic spacer, and the MTJ;

wherein application of the electrical current to the inducible precessional magnetic layer, the non-magnetic spacer and the MTJ produces a spin-polarized current having spin-polarized electrons, the spin-polarized electrons exerting a spin transfer torque on the magnetization vector of the free magnetic layer, the direction of the spin transfer torque determined in part by the direction of the magnetization vector of the inducible precessional magnetic layer;

wherein the induced rotation frequency is synchronized with the predetermined precession frequency of the free magnetic layer, thereby causing spin transfer torque to assist switching of the magnetization vector of the free magnetic layer from the first magnetization direction to the second magnetization direction and from the second magnetization direction to the first magnetization direction.

2. The magnetic device of claim 1, wherein a difference in frequency between the induced rotation frequency and the predetermined precession frequency of the free magnetic layer is less than twenty percent of the predetermined precession frequency of the free magnetic layer.

3. The magnetic device of claim 1, wherein a difference in frequency between the induced rotation frequency and the predetermined precession frequency of the free magnetic layer is less than ten percent of the predetermined precession frequency of the free magnetic layer.

4. The magnetic device of claim 1, wherein a difference in frequency between the induced rotation frequency and the predetermined precession frequency of the free magnetic layer is less than five percent of the predetermined precession frequency of the free magnetic layer.

5. The magnetic device of claim 1, wherein a difference in frequency between the induced rotation frequency and the predetermined precession frequency of the free magnetic layer is less than two percent of the predetermined precession frequency of the free magnetic layer.

6. The magnetic device of claim 1, wherein the external alternating magnetic field exerts a force on the magnetization vector of the free magnetic layer, thereby assisting in the switching of the magnetization direction of the free magnetic layer.

7. The magnetic device of claim 1, wherein the external alternating magnetic field enhances the precession of the magnetization vector of the free magnetic layer.

8. The magnetic device of claim 1, wherein switching the magnetization direction of the free magnetic layer requires both the first current source directing the alternating current through the external wire, and the second current source directing the programming current through the inducible precessional magnetic layer, the non-magnetic spacer, the free magnetic layer, the non-magnetic tunnel barrier layer, and the reference magnetic layer.

9. The magnetic device of claim 1, wherein switching the magnetization direction of the free magnetic layer requires the magnetization vector of the inducible precessional magnetic layer to rotate at the induced rotation frequency.

10. The magnetic device of claim 1, wherein switching the magnetization direction of the free magnetic layer requires generating the external alternating magnetic field.

11. The magnetic device of claim 1, wherein the inducible precessional magnetic layer has a weak in-plane anisotropy.

12. The magnetic device of claim 1, wherein the inducible precessional magnetic layer comprises CoFeB.

13. The magnetic device of claim 1, wherein the programming current comprises a direct current.

14. The magnetic device of claim 1, wherein the non-magnetic spacer prevents coupling of the free magnetic layer to the inducible precessional magnetic layer.

15. The magnetic device of claim 1, wherein the free magnetic layer comprises CoFeB, the non-magnetic tunnel barrier layer comprises MgO, and the free magnetic layer comprises CoFeB.

16. A magnetic device comprising:
a magnetic tunnel junction (MTJ) in a first plane, the MTJ comprising a reference magnetic layer, a non-magnetic tunnel barrier layer, and a free magnetic layer, the free magnetic layer and the reference magnetic layer separated by the non-magnetic tunnel barrier layer, the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions around an axis perpendicular to the first plane, the magnetization vector of the free magnetic layer having a predetermined precession frequency;

a non-magnetic spacer in a second plane, separating the MTJ from an inducible precessional magnetic layer;

the inducible precessional magnetic layer in a third plane and coupled to the non-magnetic spacer, the inducible precessional magnetic layer having a magnetization vector with a magnetization component in the third plane that can freely rotate at an induced rotation frequency in the presence of an external alternating magnetic field and is fixed in the absence of the external alternating magnetic field; and an external wire that is physically separate from the MTJ, the non-magnetic spacer and the inducible precessional magnetic layer, the external wire generating the external alternating magnetic field upon direction of an alternating current through the external wire; wherein the external wire is located proximate to the inducible precessional magnetic layer, thereby enabling the external alternating magnetic field to induce precession of the magnetization vector of the inducible precessional magnetic layer;

wherein application of a programming current to the inducible precessional magnetic layer, the non-magnetic spacer and the MTJ produces a spin-polarized current having spin-polarized electrons, the spin-polarized electrons exerting a spin transfer torque on the magnetization vector of the free magnetic layer, the direction of the spin transfer torque determined in part by the direction of the magnetization vector of the inducible precessional magnetic layer;

wherein the induced rotation frequency is synchronized with the predetermined precession frequency of the free magnetic layer, thereby causing spin transfer torque to assist switching of the magnetization vector of the free magnetic layer from the first magnetization direction to the second magnetization direction and from the second magnetization direction to the first magnetization direction.

17. The magnetic device of claim 16, the magnetic device further comprising a first current source that is physically separate from the MTJ, the non-magnetic spacer and the inducible precessional magnetic layer, the first current source directing the alternating current through the external wire, thereby generating the external alternating magnetic field; and a second current source that directs the programming current through the inducible precessional magnetic layer, the non-magnetic spacer, and the MTJ.

18. The magnetic device of claim 16, wherein a difference in frequency between the induced rotation frequency and the predetermined precession frequency of the free magnetic layer is less than twenty percent of the predetermined precession frequency of the free magnetic layer.

19. The magnetic device of claim 16, wherein a difference in frequency between the induced rotation frequency and the predetermined precession frequency of the free magnetic layer is less than ten percent of the predetermined precession frequency of the free magnetic layer.

20. The magnetic device of claim 16, wherein a difference in frequency between the induced rotation frequency and the predetermined precession frequency of the free magnetic layer is less than five percent of the predetermined precession frequency of the free magnetic layer.

21. The magnetic device of claim 16, wherein a difference in frequency between the induced rotation frequency and the predetermined precession frequency of the free magnetic layer is less than two percent of the predetermined precession frequency of the free magnetic layer.

22. The magnetic device of claim 16, wherein the external alternating magnetic field exerts a force on the magnetization vector of the free magnetic layer, thereby assisting in the switching of the magnetization direction of the free magnetic layer.

23. The magnetic device of claim 16, wherein the external alternating magnetic field enhances the precession of the magnetization vector of the free magnetic layer.

24. The magnetic device of claim 16, wherein switching the magnetization direction of the free magnetic layer requires both a first current source directing the alternating current through the external wire, and a second current source directing the programming current through the inducible precessional magnetic layer, the non-magnetic spacer, and the MTJ.

25. The magnetic device of claim 16, wherein switching the magnetization direction of the free magnetic layer requires the magnetization vector of the inducible precessional magnetic layer to rotate at the induced rotation frequency.

26. The magnetic device of claim 16, wherein switching the magnetization direction of the free magnetic layer requires generating the external alternating magnetic field.

27. The magnetic device of claim 16, wherein the inducible precessional magnetic layer has a weak in-plane anisotropy.

28. The magnetic device of claim 16, wherein the inducible precessional magnetic layer comprises CoFeB.

29. The magnetic device of claim 16, wherein the non-magnetic spacer prevents coupling of the free magnetic layer to the inducible precessional magnetic layer.

30. The magnetic device of claim 16, wherein the free magnetic layer comprises CoFeB, the non-magnetic tunnel barrier layer comprises MgO, and the free magnetic layer comprises CoFeB.

31. A magnetic device comprising:

an inducible precessional magnetic layer in a first plane, the inducible precessional magnetic layer having a magnetization vector with a magnetization component in the first plane that rotates at an induced rotation frequency in the presence of an external alternating magnetic field and is fixed in the absence of the external alternating magnetic field;

a non-magnetic spacer in a second plane and disposed over the inducible precessional magnetic layer;

a free magnetic layer in a third plane and disposed over the non-magnetic spacer layer, the free magnetic layer having a magnetization vector that is perpendicular to the third plane and having a magnetization direction that can switch from a first magnetization direction to a second magnetization direction and from the second magnetization direction to the first magnetization direction, with a switching process that involves precessions around an axis perpendicular to the third plane, the magnetization vector of the free magnetic layer having a predetermined precession frequency;

a non-magnetic tunnel barrier layer in a fourth plane and disposed over the free magnetic layer;

a reference magnetic layer in a fifth plane and disposed over the non-magnetic tunnel barrier layer, the reference magnetic layer having a magnetization vector that is perpendicular to the fifth plane and having a fixed magnetization direction, the reference magnetic layer, the non-magnetic tunnel barrier layer and the free magnetic layer forming a magnetic tunnel junction (MTJ);

an external wire that is physically separate from the MTJ, the non-magnetic spacer and the inducible precessional magnetic layer, the external wire generating the external alternating magnetic field upon direction of an alternating current through the external wire; wherein the external wire is proximate to the inducible precessional magnetic layer, thereby enabling the external alternating magnetic field to induce precession of the magnetization vector of the inducible precessional magnetic layer;

a first current source that is physically separate from the MTJ, the non-magnetic spacer and the inducible precessional magnetic layer, the first current source directing an alternating current through the external wire, thereby generating the external alternating magnetic field; and a second current source that directs a programming current through the inducible precessional magnetic layer, the non-magnetic spacer, and the MTJ;

wherein application of the electrical current to the inducible precessional magnetic layer, the non-magnetic spacer and the MTJ produces a spin-polarized current having spin-polarized electrons, the spin-polarized electrons exerting a spin transfer torque on the magnetization vector of the free magnetic layer, the direction of the spin transfer torque determined in part by the direction of the magnetization vector of the inducible precessional magnetic layer;

wherein the induced rotation frequency is synchronized with the predetermined precession frequency of the free magnetic layer, thereby causing spin transfer torque to assist switching of the magnetization vector of the free magnetic layer from the first magnetization direction to the second magnetization direction and from the second magnetization direction to the first magnetization direction.

32. The magnetic device of claim 31, wherein a difference in frequency between the induced rotation frequency and the predetermined precession frequency of the free magnetic layer is less than twenty percent of the predetermined precession frequency of the free magnetic layer.

33. The magnetic device of claim 31, wherein a difference in frequency between the induced rotation frequency and the predetermined precession frequency of the free magnetic layer is less than ten percent of the predetermined precession frequency of the free magnetic layer.

34. The magnetic device of claim 31, wherein a difference in frequency between the induced rotation frequency and the predetermined precession frequency of the free magnetic layer is less than five percent of the predetermined precession frequency of the free magnetic layer.

35. The magnetic device of claim 31, wherein a difference in frequency between the induced rotation frequency and the predetermined precession frequency of the free magnetic layer is less than two percent of the predetermined precession frequency of the free magnetic layer.

36. The magnetic device of claim 31, wherein the external alternating magnetic field exerts a force on the magnetization vector of the free magnetic layer, thereby assisting in the switching of the magnetization direction of the free magnetic layer.

37. The magnetic device of claim 31, wherein the external alternating magnetic field enhances the precession of the magnetization vector of the free magnetic layer.

38. The magnetic device of claim 31, wherein switching the magnetization direction of the free magnetic layer requires both the first current source directing the alternating current through the external wire, and the second current source directing the programming current through the inducible precessional magnetic layer, the non-magnetic spacer, and the MTJ.

39. The magnetic device of claim 31, wherein switching the magnetization direction of the free magnetic layer requires the magnetization vector of the inducible precessional magnetic layer to rotate at the induced rotation frequency.

40. The magnetic device of claim 31, wherein switching the magnetization direction of the free magnetic layer requires generating the external alternating magnetic field.

41. The magnetic device of claim 31, wherein the inducible precessional magnetic layer has a weak in-plane anisotropy.

42. The magnetic device of claim 31, wherein the inducible precessional magnetic layer comprises CoFeB.

43. The magnetic device of claim 31, wherein the non-magnetic spacer comprises MgO.

44. The magnetic device of claim 31, wherein the non-magnetic spacer prevents coupling of the free magnetic layer to the inducible precessional magnetic layer.

45. The magnetic device of claim 31, wherein the free magnetic layer comprises CoFeB, the non-magnetic tunnel barrier layer comprises MgO, and the free magnetic layer comprises CoFeB.

\* \* \* \* \*